United States Patent
Hayamizu

(10) Patent No.: US 10,381,957 B2
(45) Date of Patent: Aug. 13, 2019

(54) POWER GENERATION DEVICE

(71) Applicant: Soundpower Corporation, Fujisawa-shi, Kanagawa (JP)

(72) Inventor: Kohei Hayamizu, Mitaka (JP)

(73) Assignee: Soundpower Corporation, Kanagawa (JP)

( * ) Notice: Subject to any disclaimer, the term of this patent is extended or adjusted under 35 U.S.C. 154(b) by 290 days.

(21) Appl. No.: 15/390,099

(22) Filed: Dec. 23, 2016

(65) Prior Publication Data

US 2017/0126149 A1    May 4, 2017

Related U.S. Application Data

(63) Continuation-in-part of application No. PCT/JP2014/067130, filed on Jun. 27, 2014.

(51) Int. Cl.
*H02N 2/18* (2006.01)
*H01L 41/04* (2006.01)
(Continued)

(52) U.S. Cl.
CPC ......... *H02N 2/186* (2013.01); *H01L 41/0475* (2013.01); *H01L 41/113* (2013.01)

(58) Field of Classification Search
CPC ............... H01L 41/113; H01L 41/1132; H01L 41/1134; H01L 41/1136; H01L 41/1138
(Continued)

(56) References Cited

U.S. PATENT DOCUMENTS 4,952,836 A * 8/1990 Robertson ........... H01L 41/1136
                                                    310/330
2011/0260583 A1* 10/2011 Lee ........................ F03D 9/25
                                                    310/339
(Continued)

FOREIGN PATENT DOCUMENTS

EP    2209201 A1    7/2010
JP    59-200683 A    11/1984
(Continued)

OTHER PUBLICATIONS

Diginfo News, "Soundpower Generates Power from Sound and Vibration: Diginfo," transcript of YouTube video downloaded from https://youtu.be/XhMTASzOnMM on Dec. 27, 2016, 1 p.
(Continued)

*Primary Examiner* — Derek J Rosenau
(74) *Attorney, Agent, or Firm* — Leydig, Voit & Mayer, Ltd.

(57) ABSTRACT

A power generation device is provided with: power generation plates, each of which has a vibration plate, and a piezoelectric element that is fixed to one side surface of the vibration plate, said power generation plates being disposed in parallel to each other such that the power generation plates overlap each other at intervals; and supporting sections, which are provided among the power generation plates, and which support the power generation plates. A supporting section in contact with the one side surface of the power generation plate is formed of a conductive material, a first electrode is integrally formed with the supporting section, a supporting section in contact with the other side surface of the power generation plate is formed of a conductive material, a second electrode having a polarity different from that of the first electrode is formed separately from the supporting section, the supporting section is disposed at a substantially center position of the side surface of
(Continued)

the power generation plate, and the supporting section is disposed at a substantially peripheral position of the side surface of the power generation plate.

11 Claims, 17 Drawing Sheets

(51) Int. Cl.
*H01L 41/113* (2006.01)
*H01L 41/047* (2006.01)

(58) Field of Classification Search
USPC .......................................................... 310/339
See application file for complete search history.

(56) References Cited

U.S. PATENT DOCUMENTS

| | | |
|---|---|---|
| 2013/0238072 A1 | 9/2013 | Deterre et al. |
| 2014/0327339 A1 | 11/2014 | Katsumura et al. |

FOREIGN PATENT DOCUMENTS

| | | |
|---|---|---|
| JP | 2005-312269 A | 11/2005 |
| JP | 2005-323430 A | 11/2005 |
| JP | 2007-097278 A | 4/2007 |
| JP | 2009-247128 A | 10/2009 |
| JP | 2010-200607 A | 9/2010 |
| JP | 2011-250536 A | 12/2011 |
| JP | 2013-143874 A | 7/2013 |
| JP | 2014-033478 A | 2/2014 |
| JP | 2014-039405 A | 2/2014 |
| JP | 2014-131408 A | 7/2014 |
| JP | 2014-131409 A | 7/2014 |
| WO | WO 2013/121759 A1 | 8/2013 |

OTHER PUBLICATIONS

European Patent Office, Extended European Search Report in European Patent Application No. 14896165.9, 8 pp. (dated Jan. 23, 2018).

Japanese Patent Office, International Search Report in International Patent Application No. PCT/JP2014/067130, 2 pp. (dated Nov. 4, 2014).

Japanese Patent Office, Written Opinion in International Patent Application No. PCT/JP2014/067130, 8 pp. (dated Nov. 4, 2014).

* cited by examiner

10,381,957 B2

POWER GENERATION DEVICE

CROSS-REFERENCE TO RELATED APPLICATIONS

This application is a continuation-in-part of International Patent Application No. PCT/JP2014/067130, filed Apr. 7, 2014, which is incorporated by reference herein in its entirety for all purposes.

TECHNICAL FIELD

The present invention relates to a power generation device.

BACKGROUND ART

Conventionally, a power generation device that generates power using a piezoelectric element has been proposed. For example, a power generation device that obtains electromotive power from deformation of the piezoelectric element by directly applying an external force to the piezoelectric element is disclosed (see Patent Literature 1, for example). Specifically, this power generation device is constituted with, between a pair of buffer materials, a plurality of vibration plates, a piezoelectric element fixed to a side surface of each of these vibration plates, a shaft reaching a center of each of the piezoelectric elements from one of buffer materials, and a shaft reaching a side of each of the piezoelectric elements from the other buffer material. As a power generation function of this power generation device, when the buffer materials are subjected to an external force and deformed, this external force is sequentially transmitted to each of the vibration plates and each of the piezoelectric elements through the shaft and deforms each of the vibration plates and each of the piezoelectric elements so that they are warped, whereby power generation is performed. A positive terminal is connected to one of side surfaces of each of the piezoelectric elements and a negative terminal is connected to the other side surface of each of the piezoelectric elements, a lead wire wired to the positive terminal and the negative terminal is withdrawn and connected to external equipment through a control circuit, not shown, and thus, electric power generated by the piezoelectric elements is supplied to the external equipment.

CITATION LIST—PATENT LITERATURE

Patent Literature 1: Japanese Patent Laid-Open No. 2007-097278

SUMMARY OF INVENTION

However, the aforementioned conventional power generation device has a room for improvement in terms of manufacturability. For example, since the positive terminal and the negative terminal are connected to each of the piezoelectric elements, and the positive terminal (or the negative terminal) is and the lead wire are wired in order to supply electric power generated in the aforementioned conventional power generation device to the external equipment, these works require labor. Thus, a device that can improve manufacturability has been in demand.

The present invention was made in view of the above and has an object to provide a power generation device that can improve manufacturability.

In order to solve the aforementioned problem and to achieve the object, a power generation device described in claim 1 is a power generation device for converting an external force to electricity by using a power generation element and the power generation device comprises a plurality of the power generation plates juxtaposed in an overlapping state at an interval from each other, the power generation plate having the power generation element or the power generation plate having a substantially plate-shaped conductive member having flexibility and the power generation element fixed at least to either one of side surfaces of the conductive member; and a plurality of support means provided between the plurality of power generation plates and supporting the plurality of power generation plates, in which the plurality of support means are disposed so that, when an external force is applied to the power generation device, at least a part of the plurality of power generation plates is deformable along a juxtaposed direction of the plurality of power generation plates, the support means in contact with one of the side surfaces of at least one power generation plate in at least a part of the plurality of power generation plates is formed of a conductive material, a first electrode for withdrawing an electric current generated in the power generation plate to an outside with respect to the support means is formed integrally with or separately from the support means, the support means in contact with the other of the side surfaces of the power generation plate is formed of the conductive material, and a second electrode for withdrawing the electric current generated in the power generation plate to the outside with respect to the support means and with a polarity different from that of the first electrode, is formed integrally with or separately from the support means, and the support means electrically connected to the first electrode is disposed at a substantially center position or at a substantially peripheral position on the side surface of the power generation plate and the support means electrically connected to the second electrode is disposed at the substantially peripheral position on the side surface of the power generation plate.

Moreover, a power generation device described in claim 2 is the power generation device described in claim 1, in which the support means electrically connected to the first electrode is disposed at the substantially center position on the side surface of the power generation plate, and the support means electrically connected to the first electrode comprises a first contact portion provided integrally with the first electrode and in contact with one of a pair of the power generation plates supported by the support means, and a second contact portion provided integrally with the first electrode and in contact with the other of the pair of the power generation plates.

Moreover, a power generation device described in claim 3 is the power generation device described in claim 1, in which the support means electrically connected to the first electrode is disposed at the substantially center position on the side surface of the power generation plate, the power generation plate having the conductive member and the power generation element fixed to one of side surfaces of the conductive member, and a short-circuit preventing means for preventing short-circuit of the first electrode by contact between the first electrode and the conductive member of the power generation plate is provided on the first electrode.

Moreover, a power generation device described in claim 4 is the power generation device described in claim 3, in which the short-circuit preventing means is a deformation suppressing means for suppressing deformation of the power generation plate so as to prevent contact between the first electrode and the conductive member of the power generation plate.

Moreover, a power generation device described in claim 5 is the power generation device described in claim 1, in which the support means electrically connected to the first electrode is disposed at a substantially peripheral position on the side surface of the power generation plate, and the plurality of support means is disposed so that, when an external force is applied to the power generation device, the adjacent power generation plates are deformable along different directions.

Moreover, a power generation device described in claim 6 is the power generation device described in claim 1, in which the support means electrically connected to the first electrode is disposed at a substantially peripheral position on the side surface of the power generation plate, and the plurality of support means is disposed so that, when an external force is applied to the power generation device, the adjacent power generation plates are deformable along the same direction, a plurality of power generation modules is formed, each having the first electrode, the support means electrically connected to the first electrode, the second electrode, the support means electrically connected to the second electrode, and the power generation plate in which an electric current is withdrawn from the first electrode and the second electrode, and an insulating member is provided between the plurality of power generation modules.

Moreover, a power generation device described in claim 7 is the power generation device described in claim 1, in which the support means electrically connected to the first electrode is disposed at the substantially peripheral position on the side surface of the power generation plate, and the support means electrically connected to the first electrode or the support means electrically connected to the second electrode is formed having a shape substantially following a part of a periphery of the power generation plate.

Moreover, a power generation device described in claim 8 is the power generation device described in any one of claims 1 to 7, in which an operation means for transmitting the external force to the plurality of power generation plates by moving itself when an external force is applied to the power generation device, and a movement limiting means for limiting a moving amount of the operation means, when the external force is applied to the power generation device, are provided.

Advantageous Effect of the Invention

According to the power generation device described in claim 1, since the support means in contact with one of the side surfaces of at least one power generation plate in at least a part of the plurality of power generation plates is formed by a conductive material, the first electrode for withdrawing the electric current generated in the power generation plate to the outside with respect to the support means is formed integrally with or separately from the support means, the support means in contact with the other of the side surfaces of the power generation plate is formed of the conductive material, and the second electrode for withdrawing the electric current generated in the power generation plate to the outside with respect to the support means and having a polarity different from that of the first electrode is formed integrally with or separately from the support means, the labor of connecting a positive terminal and a negative terminal to the power generation element of each of the power generation plate and of wiring the positive terminal (or the negative terminal) and the lead wire as in the conventional power generation device can be omitted, whereby manufacturability can be improved.

According to the power generation device described in claim 2, since the support means electrically connected to the first electrode comprises: the first contact portion provided integrally with the first electrode and in contact with one of the pair of the power generation plates supported by the support means; and the second contact portion provided integrally with the first electrode and in contact with the other of the pair of the power generation plates, the support means can be formed with an integral structure, whereby manufacturability of the support means can be improved.

According to the power generation device described in claim 3, since the short-circuit preventing means for preventing short-circuit of the first electrode by contact between the first electrode and the conductive member of the power generation plate is provided on the first electrode, the short-circuit of the first electrode by contact between the first electrode and the conductive member of the power generation plate can be prevented.

According to the power generation device described in claim 4, since the short-circuit preventing means is the deformation suppressing means for suppressing deformation of the power generation plate so as to prevent contact between the first electrode and the conductive member of the power generation plate, the contact between the first electrode and the conductive member of the power generation plate can be avoided by suppressing the deformation of the power generation plate, and durability of the power generation plate can be further improved in a structure capable of preventing the short-circuit of the first electrode.

According to the power generation device described in claim 5, since the plurality of support means is disposed so that, when an external force is applied to the power generation device, the adjacent power generation plates are deformable along different directions, each of the plurality of power generation plates can be supported in a cantilever manner. As a result, as compared with support of each of the plurality of power generation plates on both sides, for example, the number of installed support means can be reduced, and weight reduction and cost reduction can be realized.

According to the power generation device described in claim 6, since the plurality of support means is disposed so that, when an external force is applied to the power generation device, the adjacent power generation plates are deformable along the same direction, the plurality of power generation plates can be deformed substantially uniformly, whereby power generation efficiency can be improved. Moreover, the plurality of power generation modules, each of which has the first electrode, the support means electrically connected to the first electrode, the second electrode, the support means electrically connected to the second electrode, and the power generation plate in which an electric current is withdrawn from the first electrode and the second electrode, is formed, and the insulating member is provided between the plurality of power generation modules and thus, a flow of the electric current between the adjacent power generation modules can be shut off, and occurrence of short-circuit between the adjacent power generation modules can be prevented.

According to the power generation device described in claim 7, since the support means electrically connected to the first electrode or the support means electrically connected to the second electrode is formed having a shape substantially following a part of the periphery of the power generation plate, these support means can be manufactured inexpensively while stable support of the plurality of power generation plates is maintained as compared with the case where the shape follows the whole of the periphery of the power generation plate.

According to the power generation device described in claim 8, since a movement limiting means for limiting a moving amount of the operation means, when the external force is applied to the power generation device, is provided, excessive deformation of the plurality of power generation plates can be prevented, and breakage of the plurality of the power generation plates and the like can be reduced.

BRIEF DESCRIPTION OF THE DRAWINGS

FIGS. 7 are views illustrating details of formation of a first supporting section, in which

FIGS. 8 are side views illustrating electromotive situations of the power generation device according to the embodiment 1, in which

FIGS. 12 are side views illustrating electromotive situations of the power generation device according to the embodiment 2, in which

FIGS. 14 are side views illustrating electromotive situations of the power generation device according to the embodiment 3, in which

FIG. 21 are side views illustrating electromotive situations of the power generation device illustrated in FIG. 20, in which

DESCRIPTION OF EMBODIMENTS

Embodiments of a power generation device according to the present invention will be described below in detail by referring to the attached drawings. However, the present invention is not limited by these embodiments. An application target of the power generation device according to the embodiments is arbitrary but application to a call button, a remote controller, and power generation shoes can be considered, for example. In the following embodiments, a case where the power generation device is applied to the call button will be described as an example.

Embodiment 1

First, an embodiment 1 will be described. This mode is a mode in which a support means electrically connected to a first electrode is disposed at a substantially center position on a side surface of a power generation plate and a support means electrically connected to a second electrode is disposed at a substantially peripheral position on the side surface of the power generation plate.

Configuration

Figure 1:
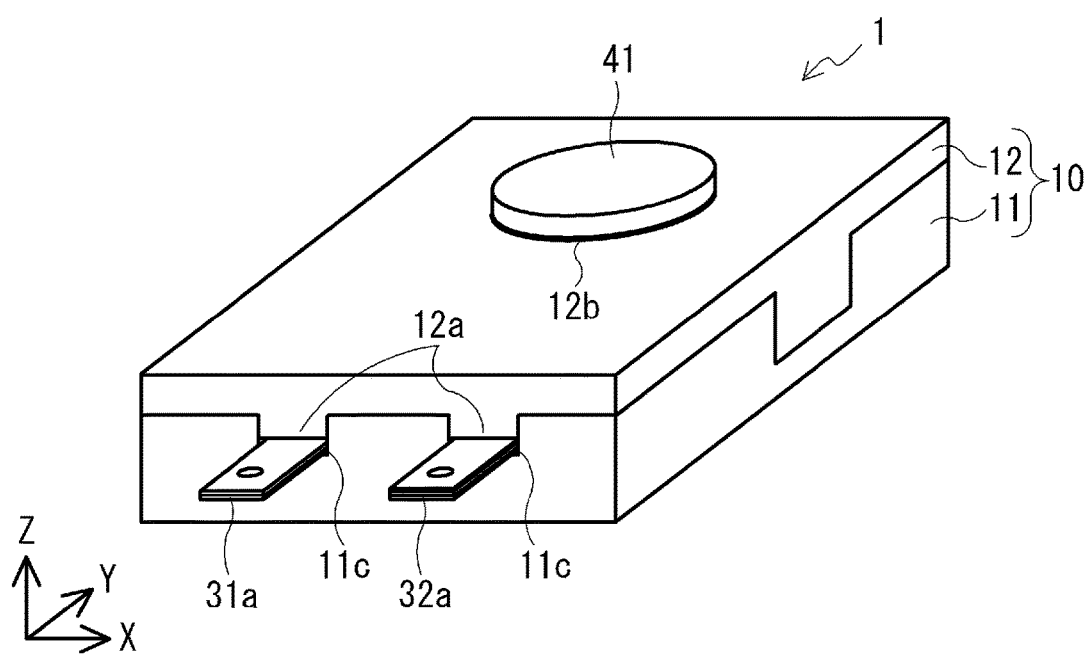
FIG. 1 is a perspective view illustrating a power generation device according to an embodiment 1 of the present invention.
Figure 2:
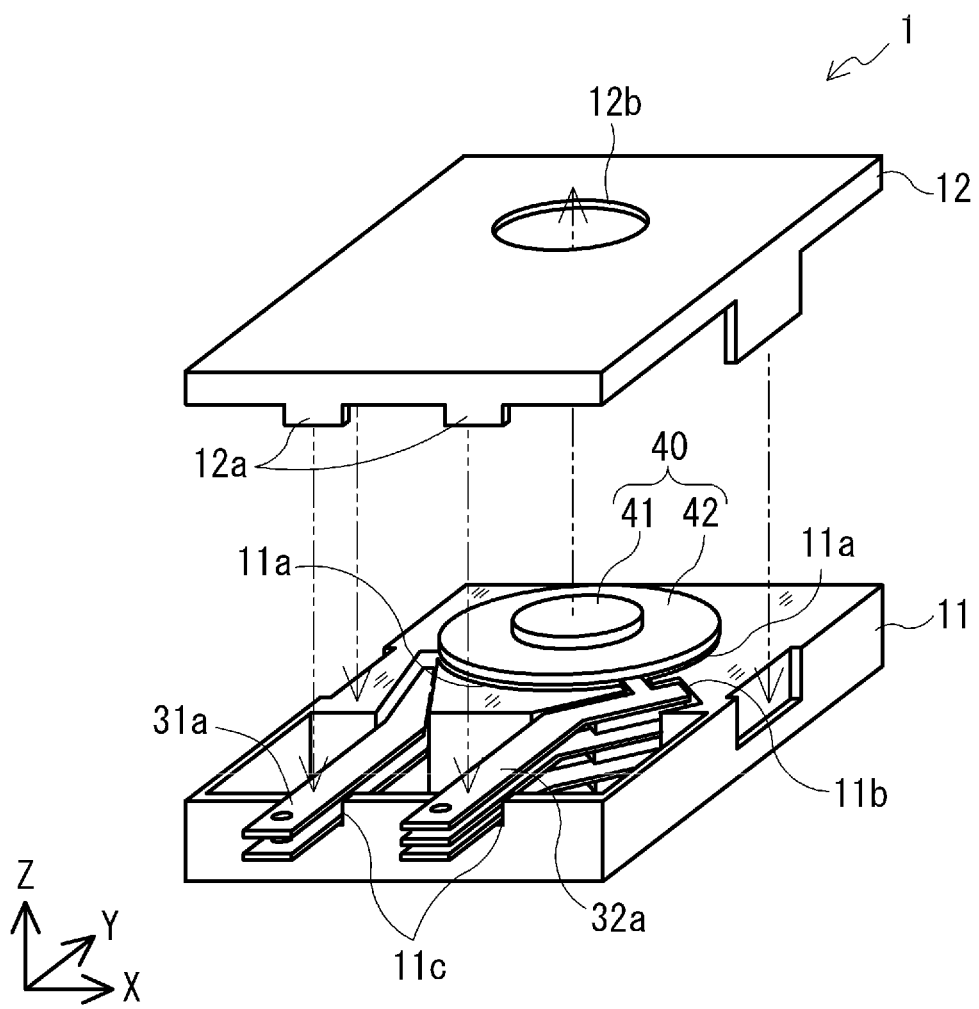
FIG. 2 is a perspective view illustrating a state where a housing in FIG. 1 is open.
Figure 3:
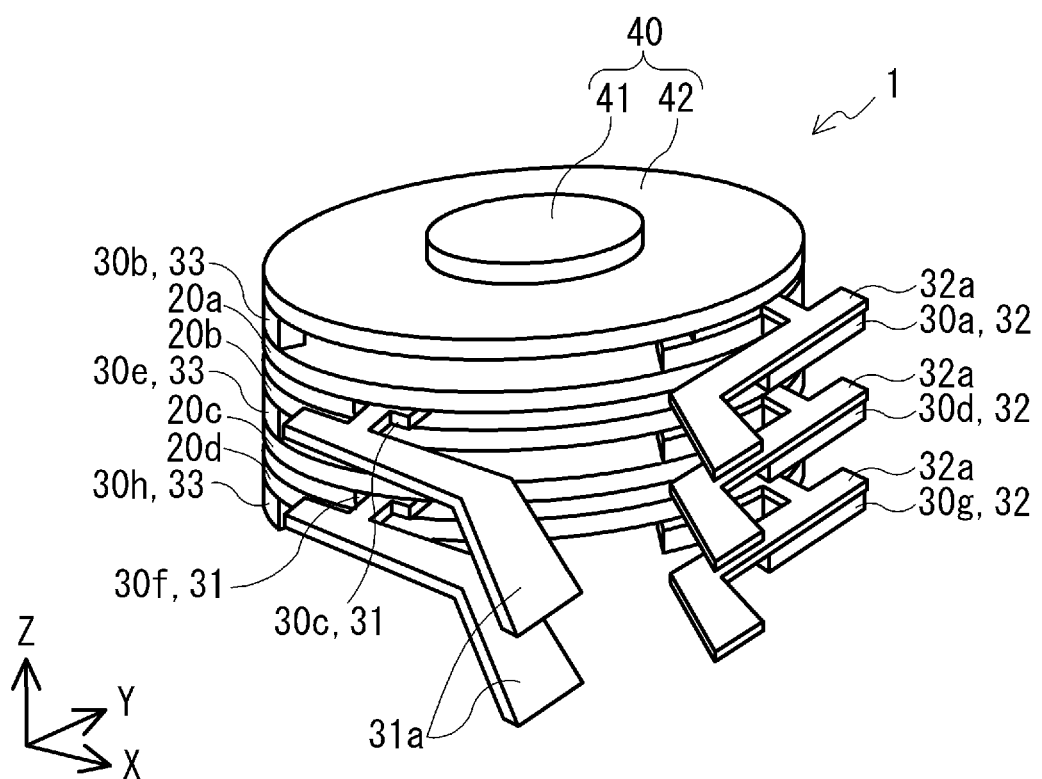
FIG. 3 is a perspective view illustrating an internal structure of the power generation device (the housing is omitted).
Figure 4:
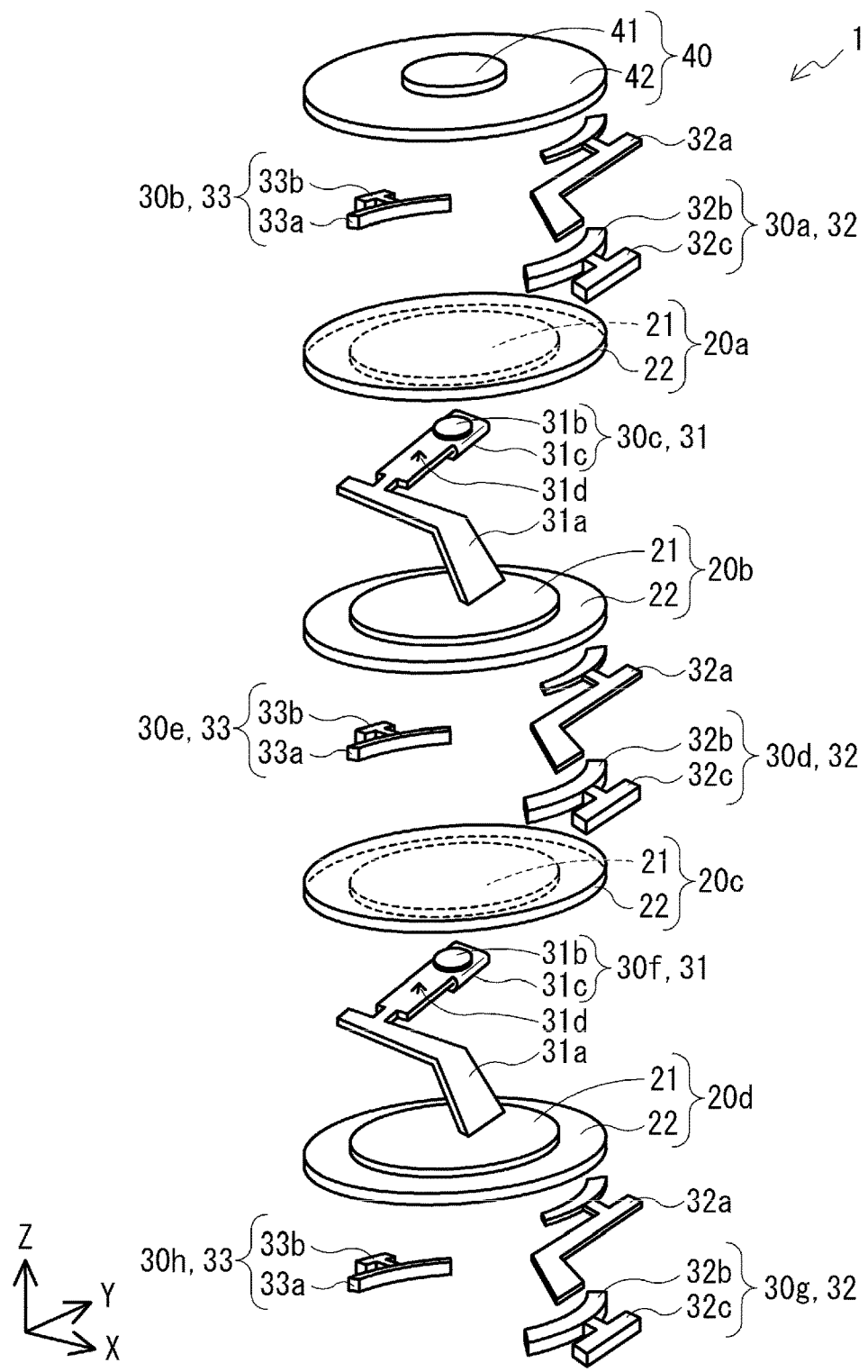
FIG. 4 is an exploded perspective view of FIG. 3.
Figure 5:
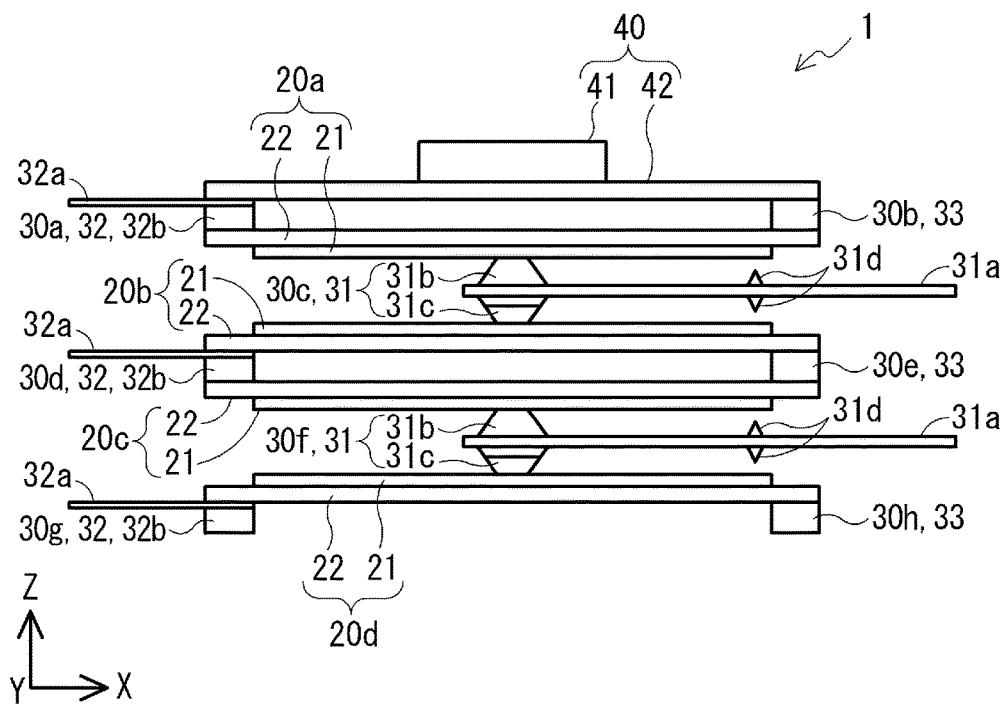
FIG. 5 is a side view of the power generation device in FIG. 3.

First, configuration of the power generation device according to the embodiment 1 will be described. FIG. 1 is a perspective view illustrating the power generation device according to the embodiment 1 of the present invention. FIG. 2 is a view illustrating a state where a housing 10 which will be described later in FIG. 1 is open. FIG. 3 is a perspective view illustrating an internal structure of the power generation device (the housing 10 which will be described later is omitted). FIG. 4 is an exploded perspective view of FIG. 3. FIG. 5 is a side view of the power generation device in FIG. 3. In the following explanation, it is assumed that an X-direction in FIG. 1 refers to a left-right direction of the power generation device, a Y-direction in FIG. 1 refers to a front-rear direction of the power generation device, and a Z-direction in FIG. 1 refers to an up-down direction of the power generation device. In FIGS. 1 to 5, illustration of a circuit board 50 which will be described later is omitted for simplification of the figures (the same applies to the FIG. 8 which will be described later). As illustrated in each of these figures, the power generation device 1 comprises power generation plates 20a to 20d illustrated in FIGS. 3 to 5, supporting sections 30a to 30h, and an operation portion 40 (however, a pressure receiving portion 41 of the operation portion 40 which will be described later is exposed to an outside) inside the housing 10 illustrated in FIG. 1 (when the power generation plates 20a to 20d do not have to be discriminated from each other, they are collectively referred to as the "power generation plate 20". Moreover, when the supporting sections 30a to 30h do not have to be discriminated from each other, they are collectively referred to as the "supporting section 30".) Moreover, the power generation device 1 is connected to an acoustic output device or the like (not shown) through the circuit board 50 which will be described later outside the housing 10 illustrated in FIG. 1.

Configuration—Housing

The housing 10 is a structural body of the power generation device 1 and is a protection means for protecting the power generation plates 20a to 20d, the supporting sections 30a to 30h, and a part of the operation portion 40 from the outside. As illustrated in FIGS. 1 and 2, the housing 10 is a substantially box-shaped body formed of a resin material, metal material subjected to insulation processing, or the like, for example. This housing 10 is constituted with a substantially box-shaped base portion 11 with one side surface (an upper surface, for example) open and containing the power generation plates 20a to 20d, the supporting sections 30a to 30h, and a part of the operation portion 40, and a cover portion 12 substantially covering this base portion 11 from its open surface side, and the cover portion 12 is fixed to the base portion 11 by a fitting structure, a fixing tool or the like.

On the base portion 11, a first fixing portion 11a, a second fixing portion 11b, and a notched portion 11c are provided. The first fixing portion 11a is a fixing means for fixing the power generation plates 20a to 20d to the base portion 11 so as not to move along the front-rear direction or along the left-right direction and is formed by integral molding with respect to the base portion 11, for example. The second fixing portion 11b is a fixing means for fixing a first electrode 31a which will be described later, a second electrode 32a which will be described later, a second supporting section 32 which will be described later or a third supporting section 33 to the base portion 11 so as not to move along the front-rear direction or along the left-right direction and is formed by integral molding with respect to the base portion 11, for example. The notched portion 11c is to withdraw the first electrode 31a which will be described later or the second electrode 32a which will be described later to outside the housing 10. This notched portion 11c is formed such that, in a side surface on a side where the first electrode 31a which will be described later or the second electrode 32a which will be described later in the housing 10 is withdrawn (front side surface of the base portion 11 illustrated in FIG. 2, for example), a part of an upper end part on the side surface has a substantially recessed shape.

On the cover portion 12, a pressing portion 12a and an opening 12b are provided. The pressing portion 12a is a pressing means by pressing the plurality of the first electrodes 31a which will be described later (or the plurality of the second electrodes 32a which will be described later) for eliminating a gap between each of them so that the first electrodes 31a (or a plurality of the second electrodes 32a which will be described later) can be easily connected to the negative terminal 51 of the circuit board 50 which will be described later (or the positive terminal 52 of the circuit board 50 which will be described later). This pressing portion 12a is formed such that, on a side surface in the cover portion 12 faced with the notched portion 11c of the base portion 11 (a front side surface of the cover portion 12 in FIG. 2), a part of a lower end part on the side surface has a substantially convex shape. The opening 12b is an opening from which the pressure receiving portion 41 of the operation portion 40 which will be described later is exposed to the outside of the housing 10.

Configuration—Power Generation Plate

The power generation plates 20a to 20d are to convert the external force applied to the power generation plates 20a to 20d to electricity. As illustrated in FIGS. 3 to 5, each of the power generation plates 20a to 20d is formed having a substantially disk shape equal to each other (it is formed having planar shape of a substantially disk shape with a diameter of approximately 20 to 30 mm or the like). These power generation plates 20a to 20d are juxtaposed at an interval from each other along the Z-direction. More specifically, all these power generation plates 20a to 20d are overlapped in a laminated manner and also, these power generation plates 20a to 20d are disposed so that centers of gravity of the power generation plates 20a to 20d are located at the same position along the juxtaposed direction. Each of these power generation plates 20a to 20d is constituted with a piezoelectric element 21 and a vibration plate 22.

Configuration—Power Generation Plate—Piezoelectric Element

The piezoelectric element 21 is an element that generates electricity by deformation by a pressure. As illustrated in FIGS. 3 to 5, the piezoelectric element 21 is formed of a piezoelectric ceramics such as barium titanate, zirconia and the like, a piezoelectric single crystal such as lithium tantalate (LiTaO3) and the like. A planar shape of this piezoelectric element 21 is formed as a shape smaller than the planar shape of the power generation plate 20, for example (formed of a substantially disk-shaped body having a planar shape having a diameter of approximately 15 to 20 mm and a thickness of approximately 0.3 mm, for example). Alternatively, not limited to that, it may be formed having a shape substantially the same as that of the power generation plate 20.

Here, as the piezoelectric element 21 or instead of the piezoelectric element 21, an arbitrary material that can generate power by an external force (including a force causing distortion, bending or compression) can be used, and an ionic polymer-metal composite (IPMC) obtained by plating metal (gold or the like) on both surfaces of a film (gel) of an ionic conductive polymer, an ionic conducting polymergel film (ICPF) or an artificial muscle using the IPMC or ICPF can be used, for example. These piezoelectric element 21 and arbitrary materials capable of power generation are collectively referred to as the "power generation element" as necessary.

Configuration—Power Generation Plate—Vibration Plate

The vibration plate 22 is a conductive member reinforcing crack strength of the piezoelectric element 21. As illustrated in FIGS. 3 to 5, the vibration plate 22 is a substantially disk-shaped body made of a steel material having flexibility and durability such as stainless steel plate or the like. The shape of this vibration plate 22 is a planar shape substantially the same as that of the power generation plate 20 and is formed with a thickness substantially the same as that of the piezoelectric element 21 (formed of the substantially disk-shaped body having the planar shape having a diameter of approximately 20 to 30 mm and a thickness of approximately 0.3 mm, for example). The piezoelectric element 21 is disposed so as to be brought into contact with either one of two side surfaces of the vibration plate 22 and is joined to the vibration plate 22 by an adhesive or the like.

Configuration—Supporting Section

The supporting sections 30a to 30h are support means for supporting the power generation plates 20a to 20d. As illustrated in FIGS. 3 to 5, the supporting sections 30 are provided between the power generation plates 20a to 20d and are provided on an upper side surface of the power generation plate 20a on an uppermost end side and on a lower side surface of the power generation plate 20d on a lowermost end side in the power generation plates 20a to 20d. This supporting section 30 is disposed at a position in contact with the side surface of the adjacent power generation plate 20. Details of the supporting section 30 will be described later.

Configuration—Operation Portion

The operation portion 40 is an operation means for transmitting the external force to the power generation plates 20a to 20d. As illustrated in FIGS. 1 to 5, the operation portion 40 is formed of an insulating material such as a resin material, a rubber material and the like and is disposed on the power generation plate 20a on the uppermost end side in the power generation plates 20a to 20d. This operation portion 40 comprises the pressure receiving portion 41 and a transmission portion 42. Here, as the method of forming the operation portion 40, a method of forming by integral molding, for example, is applicable. Alternatively, not limited to that, it may be a method of forming the pressure receiving portion 41 and the transmission portion 42 separately and then, connecting the pressure receiving portion 41 and the transmission portion 42 by welding or adhesive and the like.

Configuration—Operation Portion—Pressure Receiving Portion

The pressure receiving portion 41 is a pressure receiving means for receiving the external force. As illustrated in FIGS. 1 to 5, the pressure receiving portion 41 is formed having a substantially disk-shaped body. A planar shape of this pressure receiving portion 41 is formed as a shape smaller than the planar shape of the power generation plate 20, for example (alternatively, it may be substantially the same as the planar shape of the power generation plate 20). The pressure receiving portion 41 is disposed on an upper side surface of the transmission portion 42 so as to be exposed to the outside of the housing 10.

Configuration—Operation Portion—Transmission Portion

The transmission portion 42 is a transmitting means for transmitting the external force received through the pressure receiving portion 41 to the power generation plates 20a to 20d. As illustrated in FIGS. 2 to 5, the transmission portion 42 is a substantially disk-shaped body. A planar shape of this transmission portion 42 is formed as the substantially same shape as the planar shape of the power generation plate 20, for example (or it may be a shape larger than the planar shape of the power generation plate 20). The transmission portion 42 is disposed at a position where this transmission portion 42 is brought into contact with the supporting section 30 provided on the upper side surface of the power generation plate 20a on the uppermost end side.

Configuration—Circuit Board

Figure 6:
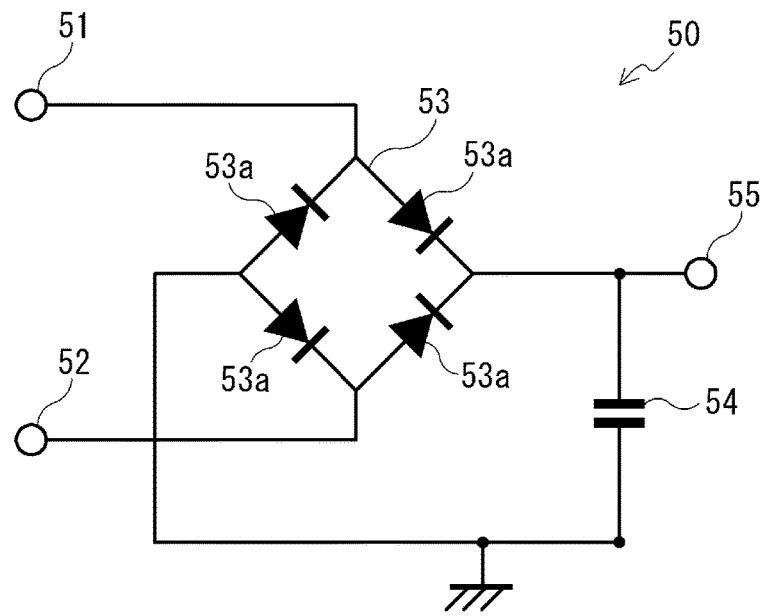
FIG. 6 is a circuit diagram illustrating configuration of a circuit board.

FIG. 6 is a circuit diagram illustrating configuration of the circuit board 50. The circuit board 50 is a board on which an electric circuit (not shown) for realizing various functions of the power generation device 1 is implemented and is disposed at a position close to the housing 10. As illustrated in FIG. 6, on this circuit board 50, the negative terminal 51, a positive terminal 52, a rectifying portion 53, a capacitor 54, and an output terminal 55 are implemented.

The negative terminal 51 and the positive terminal 52 are terminals for obtaining an electric current generated in the power generation plates 20a to 20d through the first electrode 31a which will be described later and the second electrode 32a which will be described later, and the negative terminal 51 is electrically connected to the first electrode 31a which will be described later, while the positive terminal 52 is electrically connected to the second electrode 32a which will be described later.

The rectifying portion 53 is a rectifying means for converting an electric current (specifically, an alternating current) obtained through the negative terminal 51 and the positive terminal 52 to a direct current or for making adjustment so that a cathode or an anode of a DC power supply can be connected to either of them. This rectifying portion 53 is constituted by using a well-known bridge circuit having a plurality of diodes 53a, for example, and is electrically connected to the negative terminal 51 and the positive terminal 52 through wiring.

The capacitor 54 is an element for accumulating the electric current output from the rectifying portion 53 and is electrically connected to the rectifying portion 53 through the wiring.

The output terminal 55 is a terminal for outputting the electric current output from the capacitor 54 and is electrically connected to the capacitor 54 to the acoustic output device or the like through the wiring.

Details of Supporting Section and Electrode

Subsequently, details such as configuration of the supporting section 30 and the electrode and the like according to the embodiment 1 include ingenuity as follows.

Details of Supporting Section and Electrode—Configuration of Supporting Section

First, regarding to the configuration of the supporting section 30, the supporting section 30 can be broadly divided into a first supporting section 31, a second supporting section 32 and a third supporting section 33 as illustrated in FIGS. 3 to 5.

The first supporting section 31 and the second supporting section 32 have a function of supporting the power generation plates 20a to 20d and a function of withdrawing the electric current generated in the power generation plates 20a to 20d to the outside with respect to the supporting section 30. As the first supporting section 31, the supporting sections 30c and 30f are applicable, for example, and as the second supporting section 32, the supporting sections 30a, 30d, and 30g are applicable, for example.

The third supporting section 33 has a function of simply supporting the power generation plates 20a to 20d and the supporting sections 30b, 30e, and 30h are applicable, for example.

Details of Supporting Section and Electrode—Configuration of First Supporting Section and Electrode For the configuration of the first supporting section 31 and the electrode, the following configuration is employed. Specifically, as illustrated in FIGS. 3 to 5, the first supporting section 31 is electrically connected to the first electrode 31a and is constituted with a first contact portion 31b and a second contact portion 31c.

The first electrode 31a is an electrode for withdrawing the electric current generated in the power generation plates 20a to 20d to the outside with respect to the first supporting section 31. This first electrode 31a is formed having a substantially plate-shaped body and is disposed between a pair of the power generation plates 20 supported by the first supporting section 31. This first electrode 31a is fixed to the second fixing portion 11b in the base portion 11 of the housing 10 and is electrically connected to the negative terminal 51 of the circuit board 50.

On each of the upper side surface and the lower side surface of this first electrode 31a, a deformation suppressing portion 31d is provided. The deformation suppressing portion 31d is a deformation suppressing means for suppressing deformation of the power generation plate 20 in order to prevent short-circuit of the first supporting section 31 by contact between the first electrode 31a and the vibration plate 22 of the power generation plate 20. This deformation suppressing portion 31d is made by forming a part of the first electrode 31a having a convex shape (or it may be provided separately from the first electrode 31a) and is disposed at a position faced with the piezoelectric element 21 so as to be capable of being in contact with the piezoelectric element 21 of the facing power generation plate 20.

The first contact portion 31b and the second contact portion 31c are contact means for being brought into contact with the pair of power generation plates 20 supported by the first supporting section 31. Each of the first contact portion 31b and the second contact portion 31c is formed having a substantially convex shape and is provided integrally with the first electrode 31a. The first contact portion 31b is disposed at a position in contact with one of the pair of power generation plates 20 while the second contact portion 31c is disposed at a position in contact with the other of this pair of power generation plates 20.

Details of Supporting Section and Electrode—Configuration of Second Supporting Section and Electrode For the configuration of the second supporting section 32 and the electrode, the following configuration is employed. Specifically, as illustrated in FIGS. 3 to 5, the second supporting section 32 is electrically connected to the second electrode 32a and is constituted with a support body 32b and a support body fixing portion 32c.

The second electrode 32a is an electrode for withdrawing the electric current generated in the power generation plates 20a to 20d to the outside with respect to the second supporting section 32 and with a polarity different from that of the first electrode 31a. This second electrode 32a is formed having a substantially plate-shaped body and is disposed at a position in contact through the support body 32b (or a position in direct contact) with the power generation plate 20 supported by the second supporting section 32. The second electrode 32a is fixed to the second fixing portion 11b in the base portion 11 of the housing 10 and is electrically connected to the positive terminal 52 of the circuit board 50.

The support body 32b is a portion to be a base of the second supporting section 32 and is formed having a substantially plate-shaped body. A planar shape of this support body 32b is arbitrary but is preferably formed having a shape substantially following a part of a periphery of the power generation plate 20, for example, so that the second supporting section 32 can be manufactured inexpensively. Specifically, if the planar shape of the power generation plate 20 is formed having a substantially disk shape, it is formed having a substantially arc shape (the same shall apply to the planar shape of a support body 33a of the third supporting section 33 which will be described later). This support body 32b is disposed at a position in contact (or a position in contact through the second electrode 32a) with the power generation plate 20 supported by the second supporting section 32.

The support body fixing portion 32c is a portion mounted on the second fixing portion 11b of the base portion 11 in the housing 10. This support body fixing portion 32c is formed integrally with the support body 32b, disposed so as to protrude toward this base portion 11 and is fixed to the second fixing portion 11b of this base portion 11 (the same shall apply to the support body fixing portion 33b of the third supporting section 33 which will be described later).

Details of Supporting Section and Electrode—Configuration of Third Supporting Section For the third supporting section 33, the following configuration is employed. Specifically, as illustrated in FIGS. 3 to 5, the third supporting section 33 is constituted with the support body 33a and a support body fixing portion 33b.

The support body 33a is a portion to be a base of the third supporting section 33 and is formed having a substantially plate-shaped body. This support body 33a is disposed at a position in contact with the power generation plate 20 supported by the third supporting section 33.

The support body fixing portion 33b is a portion mounted on the second fixing portion 11b of the base portion 11 in the housing 10 and is fixed to this second fixing portion 11b of the base portion 11.

As described above, by means of the aforementioned configuration of the supporting section 30 and the electrode, a labor of connecting the positive terminal and the negative terminal to the piezoelectric element 21 of each of the power generation plates 20 and wiring the positive terminal (or the negative terminal) and the lead wire as in the conventional power generation device can be omitted. Since the support body 32b of the second supporting section 32 has a shape following a part of the periphery of the power generation plate 20, the second supporting section 32 can be manufactured inexpensively, and the power generation plate 20 can be stably supported, as compared with the case of the shape following the whole of the periphery of the power generation plate 20.

Details of Supporting Section and Electrode—Materials of Supporting Section and Electrode For the materials of the first supporting section 31 to the third supporting section 33, a conductive material such as a metal material with conductivity and strength higher than that of the power generation plate 20 (copper, steel, stainless, and aluminum or the like, for example) is used, for example, so that a space for deformation of the power generation plate 20 can be maintained (the material of the third supporting section 33 may also be an insulating material such as a resin material and a rubber material). For the materials of the first electrode 31a and the second electrode 32a, a conductive material such as a metal material (copper, steel, stainless, and aluminum or the like, for example) is used.

Figure 7A:
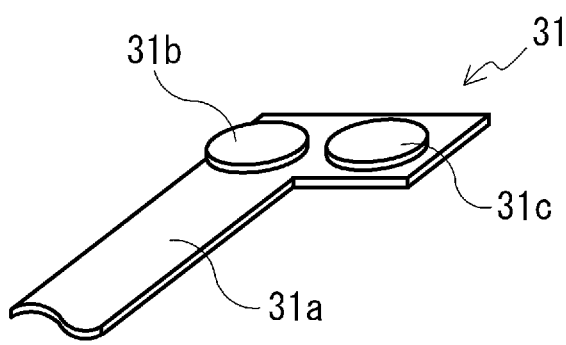
FIG. 7A is a view illustrating a state after punching.
Figure 7B:
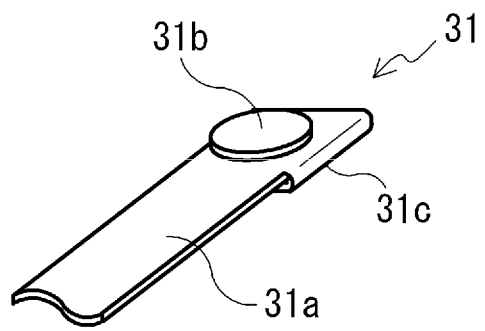
FIG. 7B is a view illustrating a state after bending.

Details of Supporting Section and Electrode—Method of Forming Supporting Section and Electrode FIGS. 7 are views illustrating details of formation of the first supporting section 31, in which FIG. 7A is a view illustrating a state after punching, and FIG. 7B is a view illustrating a state after bending. The method of forming the first supporting section 31 and the first electrode 31a (or the second supporting section 32 and the second electrode 32a) is arbitrary but as a method of inexpensive manufacture, a method of integral formation such that the conductive material such as a sheet of a copper plate or the like is punched as illustrated in FIG. 7A and bending is applied to the punched conductive material as illustrated in FIG. 7B is applicable, for example. Alternatively, not limited to that, it may be a method of formation by integral molding or the first supporting section 31 and the first electrode 31a may he formed separately.

Details of Supporting Section and Electrode—Thicknesses of Supporting Section and Electrode The thicknesses of the first supporting section 31 and the first electrode 31a are preferably set so that the power generation plate 20 and the first electrode 31a are not brought into contact with each other when the external force is applied to the power generation device 1, and for example, the thickness of the first supporting section 31 is set to approximately 1.1 mm, and the thickness of the first electrode 31a is set to approximately 0.2 mm. Regarding setting of the thicknesses of the second supporting section 32 and the second electrode 32a, a total of the thicknesses of the second supporting section 32 and the second electrode 32a are set so as to be the same as the thickness of the third supporting section 33, and for example, when the thickness of the third supporting section 33 is 0.6 mm, the thickness of the second supporting section 32 is set to 0.5 mm and the thickness of the second electrode 32a is set to 0.1 mm. The thicknesses of the first electrode 31a and the second electrode 32a are preferably set, for example, as illustrated in FIG. 1, so that the total of the thicknesses of a plurality of the first electrodes 31a is equal to the total of the thicknesses of a plurality of the second electrodes 32a so as for the pressing portion 12a to press the plurality of the first electrodes 31a and the plurality of the second electrode 32a evenly.

Details of Supporting Section and Electrode—Arrangement of Supporting Sections

The first supporting section 31 to the third supporting section 33 are disposed so that all the power generation plates 20a to 20d are deformable along the juxtaposed direction of the power generation plates 20a to 20d when the external force is applied to the pressure receiving portion 41 of the operation portion 40. Specifically, as illustrated in FIG. 5, the first supporting section 31 is disposed at the substantially center position on the side surface of the power generation plate 20, and the second supporting section 32 and the third supporting section 33 are disposed substantially at peripheral positions on the side surface on the side opposite to the first supporting section 31 side in the power generation plate 20 (more specifically, the supporting section 30c is disposed at the center position on a lower side surface of the power generation plate 20a, the supporting section 30a is disposed on the left peripheral position on an upper side surface of the power generation plate 20a, and the supporting section 30b is disposed on the right peripheral position on the upper side surface). With such arrangement, the structure in the power generation device 1 can be made stable.

Function of Power Generation Device

Figure 8A:
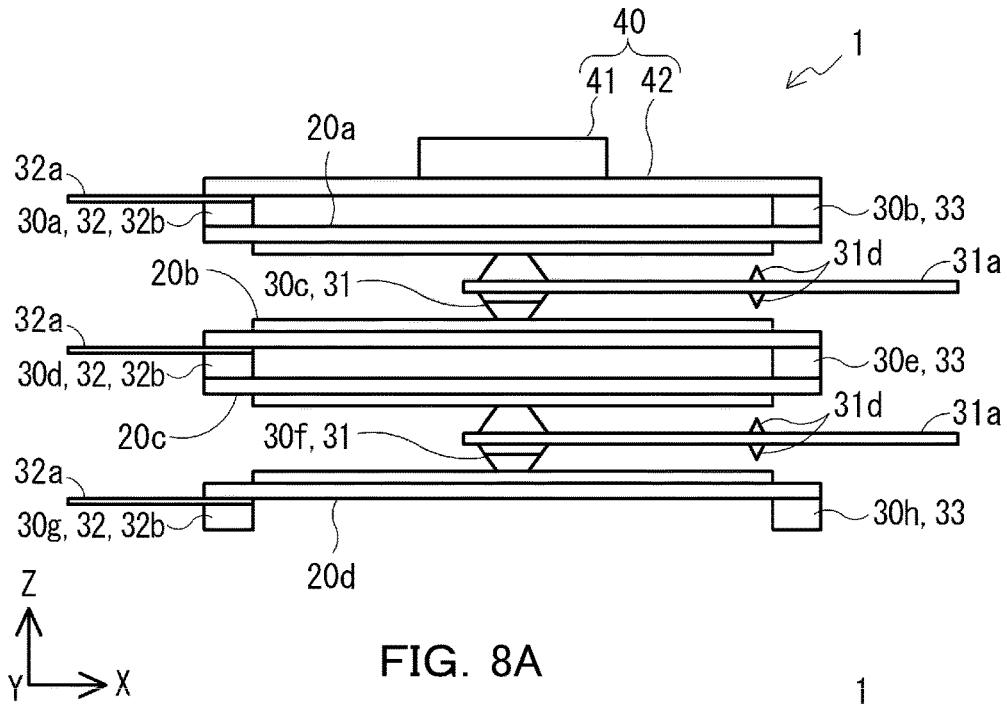
FIG. 8A is a view illustrating a state before deformation.

Functions of the power generation device 1 configured as above are as follows. FIGS. 8 are side views illustrating electromotive situations of the power generation device 1 according to the embodiment 1, in which FIG. 8A is a view illustrating a state before deformation and FIG. 8B is a view illustrating a state after the power generation device 1 is deformed upon receipt of a compression force from the outside.

Figure 8B:
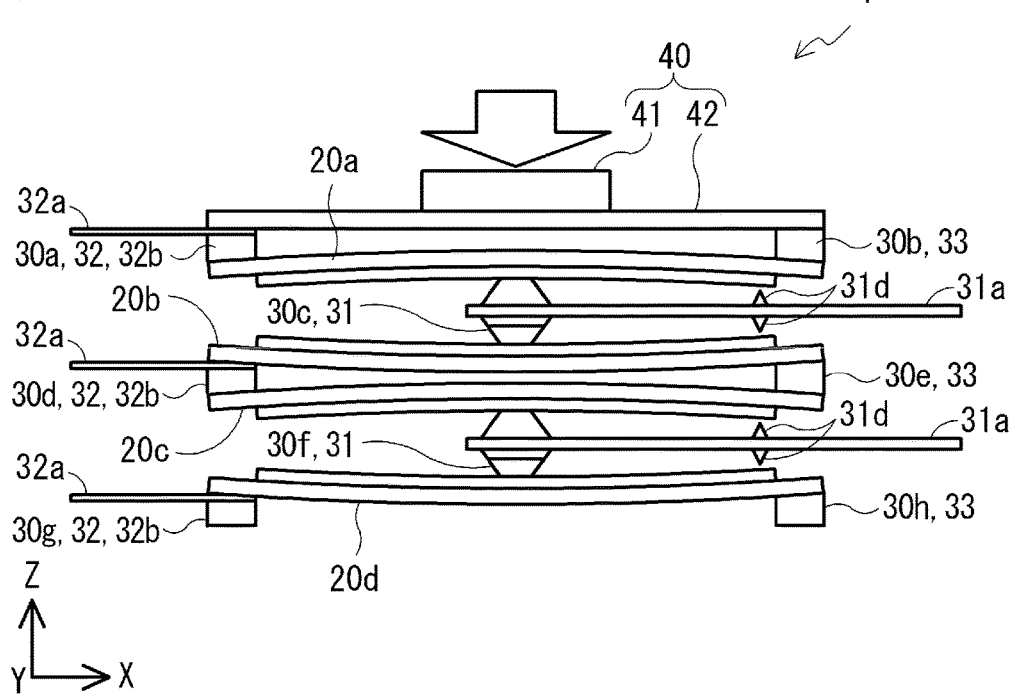
FIG. 8B is a view illustrating a state after the power generation device is deformed upon receipt of a compression force from an outside.

As illustrated FIG. 8B, regarding deformation of the power generation plates 20a to 20d when the power generation device 1 receives a compression force from the outside, the power generation plates 20a and 20c are convexly deformed upward, while the power generation plates 20b and 20d are convexly deformed downward. In this case, if the deformation of the power generation plate 20a (or the power generation plate 20b) reaches a predetermined amount, for example, the deformation suppressing portion 31d in the first electrode 31a electrically connected to the supporting section 30c and the piezoelectric element 21 of the power generation plate 20a (or the power generation plate 20b) are brought into contact with each other, whereby deformation of the power generation plate 20a (or the power generation plate 20b) is limited. As a result, the vibration plate 22 of the power generation plate 20a (or the power generation plate 20b) is brought into contact with the first electrode 31a electrically connected to the supporting section 30c, whereby short-circuit of the first electrode 31a can be prevented (the same shall apply to the case where deformation of the power generation plate 20c or 20d reaches the predetermined amount).

By the aforementioned deformation of the power generation plates 20a to 20d, electric currents of cathodes are generated on the lower side surfaces of the power generation plates 20a and 20c and on the upper side surfaces of the power generation plates 20b and 20d, and electric currents of anodes are generated on the upper side surfaces of the power generation plates 20a and 20c and the lower side surfaces of the power generation plates 20b and 20d, whereby a voltage is generated in each of the power generation plates 20. When the voltage is generated in each of the power generation plates 20 as above, the electric current of the cathode flows through the supporting sections 30c and 30f which are the first supporting sections 31 in contact with each of the power generation plates 20, and the electric current of the anode flows through the supporting sections 30a, 30d, and 30g which are the second supporting sections 32. Here, since the first electrodes 31a electrically connected to the supporting sections 30c and 30f are connected to the negative terminal 51 of the circuit board 50, the electric current of the cathode having flowed through these supporting sections 30c and 30f flows to the circuit board 50 through the first electrode 31a. Moreover, since the second electrodes 32a electrically connected to the supporting sections 30a, 30d, and 30g are connected to the positive terminal 52 of the circuit board 50, the electric current of the anode having flowed to these supporting sections 30a, 30d, and 30g flows to the circuit board 50 through the second electrode 32a. The electric current having flowed to this circuit board 50 is converted by the rectifying portion 53 to a direct current and is accumulated in the capacitor 54 and then output to the acoustic output device or the like through the output terminal 55. As a result, the electric power generated in the power generation plates 20a to 20d can be supplied to the acoustic output device or the like through the first supporting section 31, the second supporting section 32, the first electrode 31a, the second electrode 32a, and the circuit board 50.

Effect

As described above, according to the embodiment 1, in at least a part of the power generation plates 20a to 20d, the first supporting section 31 (the supporting sections 30c and 30f, for example) in contact with either one of side surfaces of at least one power generation plate 20 is formed of: a conductive material; the first electrode 31a for withdrawing the electric current generated in the power generation plate 20 to the outside with respect to the first supporting section 31 is formed integrally with the first supporting section 31; the second supporting section 32 (the supporting sections 30a, 30d, and 30g, for example) in contact with the other of the side surfaces of the power generation plate 20 is formed of the conductive material; and the second electrode 32a, with the polarity different from that of the first electrode 31a, for withdrawing the electric current generated in the power generation plate 20 to the outside with respect to the second supporting section 32 is formed separately from the second supporting section 32 so that the labor of connecting the positive terminal and the negative terminal to the piezoelectric element 21 of each of the power generation plates 20 and wiring the positive terminal (or the negative terminal) and the lead wire as in the conventional power generation device can be omitted, whereby manufacturability can be improved.

Since the first supporting section 31 electrically connected to the first electrode 31a comprises the first contact portion 31b provided integrally with the first electrode 31a and in contact with one of the pair of power generation plates 20 supported by the first supporting section 31, and the second contact portion 31c provided integrally with the first electrode 31a and in contact with the other of the pair of power generation plates, the first supporting section 31 can be formed with an integral structure, and manufacturability of the first supporting section 31 can be improved.

Moreover, since the deformation suppressing portion 31d for suppressing deformation of the power generation plate 20 is provided on the first supporting section 31 in order to prevent contact between the first electrode 31a and the vibration plate 22 of the power generation plate 20, short-circuit of the first electrode 31a can be prevented by contact between the first electrode 31a and the vibration plate 22 of the power generation plate 20, and stable power generation is made possible. Particularly, by suppressing deformation of the power generation plate 20, contact between the first electrode 31a and the vibration plate 22 of the power generation plate 20 can be avoided. As a result, in the structure capable of preventing short-circuit of the first electrode 31a, durability of the power generation plate 20 can be further improved.

Embodiment 2

Subsequently, an embodiment 2 will be described. In this mode, a support means electrically connected to the first electrode is disposed at the substantially peripheral position on the side surface of the power generation plate and a support means electrically connected to the second electrode is disposed at the substantially peripheral position on the side surface of the power generation plate and moreover, the support means are disposed so that the power generation plates adjacent to each other are deformable along different directions. However, configuration of this embodiment 2 is substantially the same as those of the embodiment 1 unless specified otherwise, and substantially the same configuration as the configuration of the embodiment 1 will be given the same reference numerals and/or names used in the embodiment 1 as necessary and the explanation thereof will be omitted.

Configuration

Figure 9:
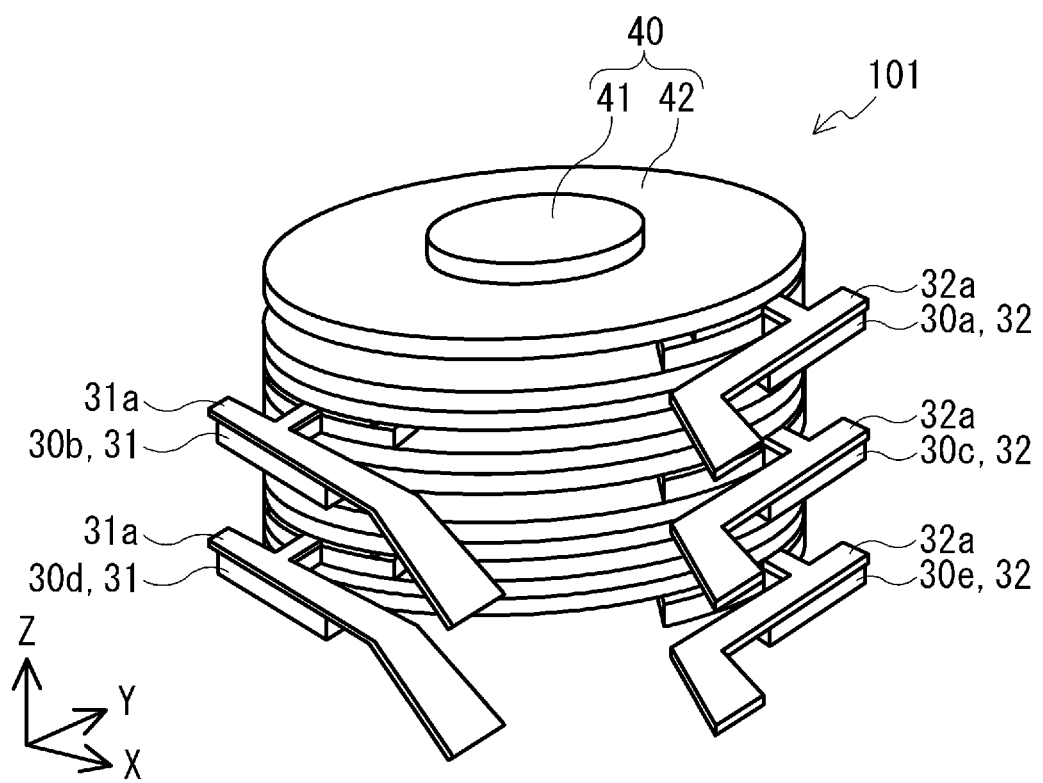
FIG. 9 is a perspective view illustrating an internal structure of a power generation device according to an embodiment 2 (a housing is omitted).
Figure 10:
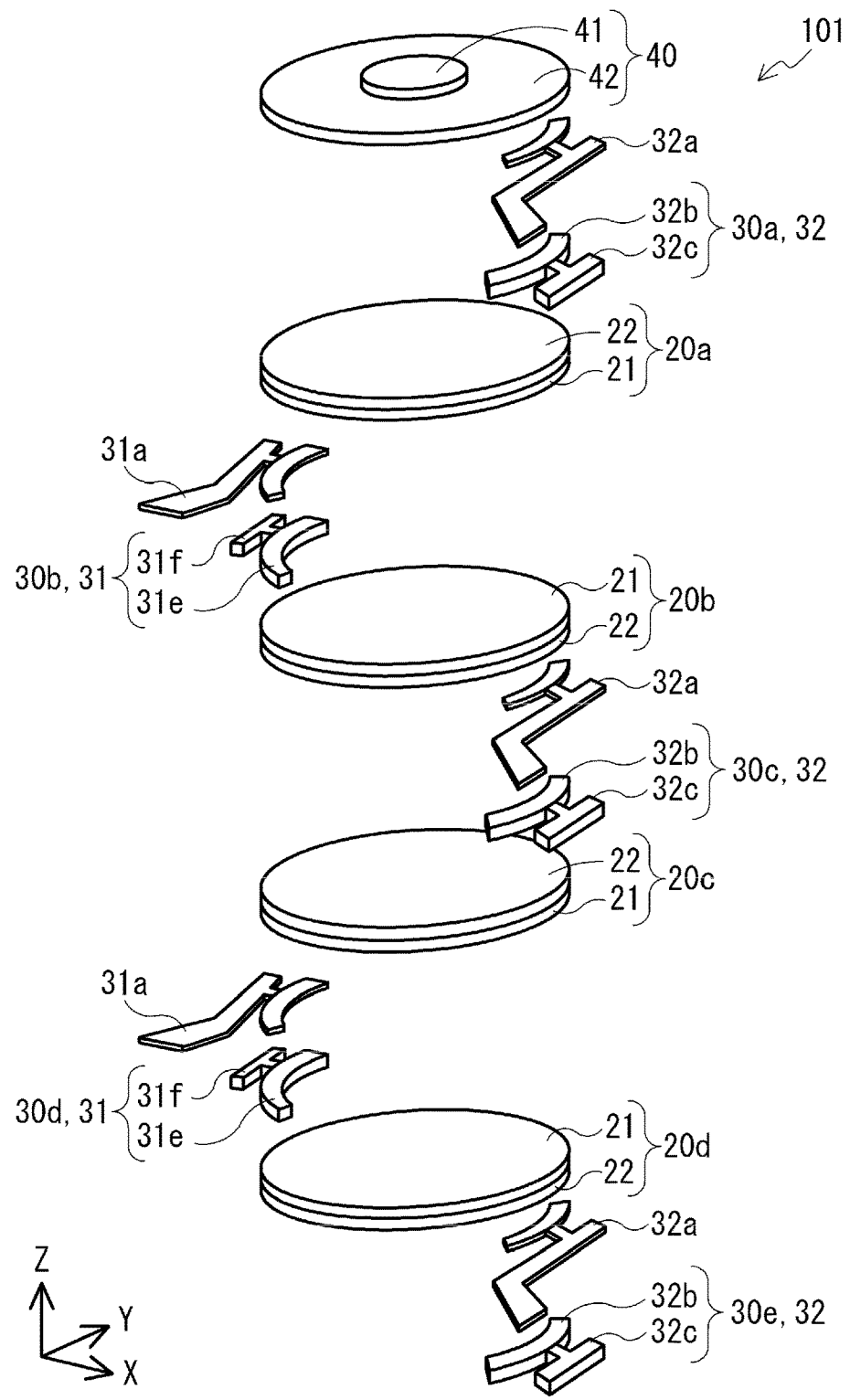
FIG. 10 is an exploded perspective view of FIG. 9.
Figure 11:
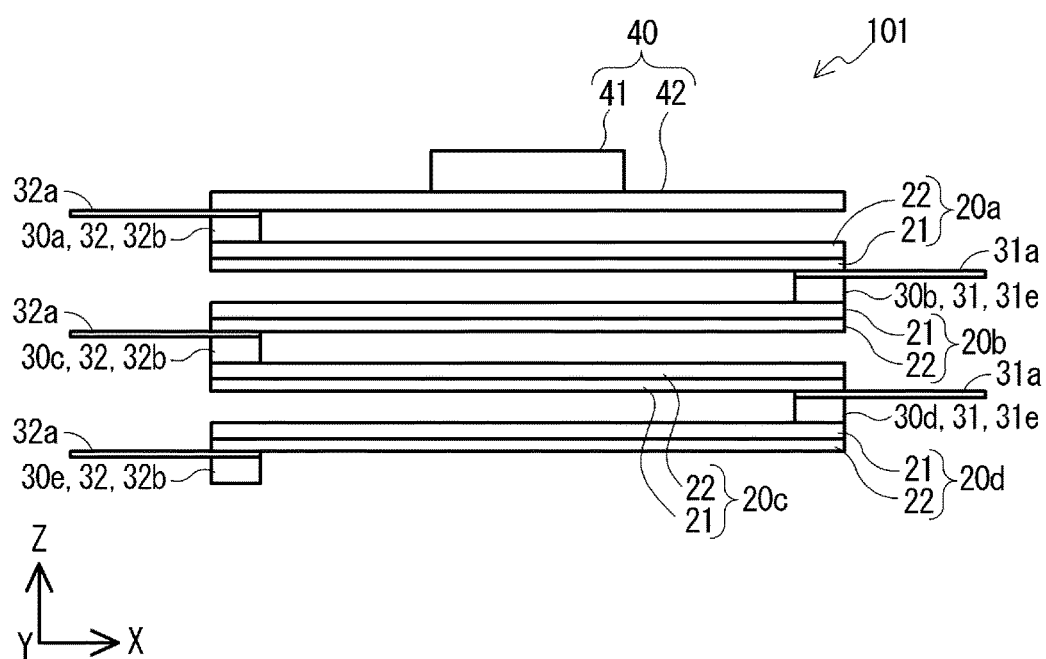
FIG. 11 is a side view of the power generation device in FIG. 9.

First, configuration of a power generation device according to the embodiment 2 will be described. FIG. 9 is a perspective view illustrating an internal structure of the power generation device according to an embodiment 2 (the housing 10 is omitted). FIG. 10 is an exploded perspective view of FIG. 9. FIG. 11 is a side view of the power generation device of FIG. 9. As illustrated in FIGS. 9 to 11, a power generation device 101 according to the embodiment 2 is configured by replacing the supporting sections 30a to 30h with the supporting sections 30a to 30e among the same components as those in the power generation device 1 according to the embodiment 1. Configuration details of the supporting section 30 and the electrode have ingenuity as follows.

Details of Supporting Section and Electrode—Configuration of Supporting Section

First, regarding the configuration of the supporting section 30 and the electrode, the supporting section 30 can be broadly divided into the first supporting section 31 and the second supporting section 32 as illustrated in FIGS. 9 to 11.

The first supporting section 31 and the second supporting section 32 have a function of supporting the power generation plates 20a to 20d and a function of withdrawing the electric current generated in the power generation plates 20a to 20d to the outside with respect to the supporting section 30. As the first supporting section 31, the supporting sections 30b and 30d are applicable, for example, and as the second supporting section 32, the supporting sections 30a, 30c, and 30e are applicable, for example.

Details of Supporting Section and Electrode—Configuration of First Supporting Section and Electrode For the configuration of the first supporting section 31 and the electrode, the following configuration is employed. Specifically, as illustrated in FIGS. 9 to 11, the first supporting section 31 is electrically connected to the first electrode 31a and is constituted with a support body 31e and a support body fixing portion 31f The first electrode 31a is an electrode for withdrawing the electric current generated in the power generation plates 20a to 20d to the outside with respect to the first supporting section 31. This first electrode 31a is formed having a substantially plate-shaped body and is disposed at a position in contact (or a position in contact through the support body 31e) with the power generation plate 20 supported by the first supporting section 31. This first electrode 31a is fixed to the second fixing portion 11b in the base portion 11 of the housing 10 and is electrically connected to the negative terminal 51 of the circuit board 50.

The support body 31e is a portion to be a base of the first supporting section 31 and is formed having a substantially plate-shaped body. A planar shape of this support body 31e is arbitrary but is preferably formed having a shape substantially following a part of the periphery of the power generation plate 20, for example, so that the first supporting section 31 can be manufactured inexpensively. Specifically, if the planar shape of the power generation plate 20 is formed having a substantially disk shape, it is formed having a substantially arc shape (the same shall apply to the planar shape of a support body 32b of the second supporting section 32 which will be described later). This support body 31e is disposed at a position in contact (or a position in contact through the first electrode 31a) with the power generation plate 20 supported by the first supporting section 31.

The support body fixing portion 31f is a portion mounted on the second fixing portion 11b of the base portion 11 in the housing 10. This support body fixing portion 31f is formed integrally with the support body 31e, disposed so as to protrude toward this base portion 11 and is fixed to the second fixing portion 11b of this base portion 11 (the same shall apply to the support body fixing portion 32c of the second supporting section 32 which will be described later).

Details of Supporting Section and Electrode—Configuration of Second Supporting Section and Electrode For the configuration of the second supporting section 32 and the electrode, the following configuration is employed. Specifically, as illustrated in FIGS. 9 to 11, the second supporting section 32 is electrically connected to the second electrode 32a and is constituted with the support body 32b and the support body fixing portion 32c.

The support body 32b is disposed at a position in contact (or a position in contact through the second electrode 32a) with the power generation plate 20 supported by the second supporting section 32.

The support body fixing portion 32c is a portion to be mounted on the second fixing portion 11b of the base portion 11 in the housing 10 and is fixed to the second fixing portion 11b of this base portion 11.

By means of the aforementioned configuration of the supporting section 30 and the electrode, the labor of connecting the positive terminal and the negative terminal to the piezoelectric element 21 of each of the power generation plates 20 and wiring the positive terminal (or the negative terminal) and the lead wire as in the conventional power generation device can be omitted. Since the support body 31b of the first supporting section 31 and the support body 32b of the second supporting section 32 have a shape following a part of the periphery of the power generation plate 20, the first supporting section 31 and the second supporting section 32 can be manufactured inexpensively, and the power generation plate 20 can be stably supported as compared with the case of the shape following the whole of the periphery of the power generation plate 20.

Details of Supporting Section and Electrode—Arrangement of Supporting Sections

The first supporting section 31 and the second supporting section 32 are disposed so that all the power generation plates 20a to 20d are deformable along the juxtaposed direction of the power generation plates 20a to 20d and also the power generation plates 20 adjacent to each other are deformable along different directions when the external force is applied to the pressure receiving portion 41 of the operation portion 40. Specifically, as illustrated in FIG. 11, the first supporting section 31 is disposed at the substantially peripheral position on the side surface of the power generation plate 20, and the second supporting section 32 is disposed at the substantially peripheral position on the side surface on the side opposite to the first supporting section 31 side in the power generation plate 20 (more specifically, the supporting section 30b is disposed at the right peripheral position on a lower side surface of the power generation plate 20a, and the supporting section 30a is disposed on the left peripheral position on an upper side surface of the power generation plate 20a). With such arrangement, the power generation plates 20a to 20d can be supported in the cantilever manner, and the number of the supporting sections 30 to be installed can be reduced as compared with the case of supporting both ends of the power generation plates 20a to 20d.

Function of Power Generation Device

Figure 12A:
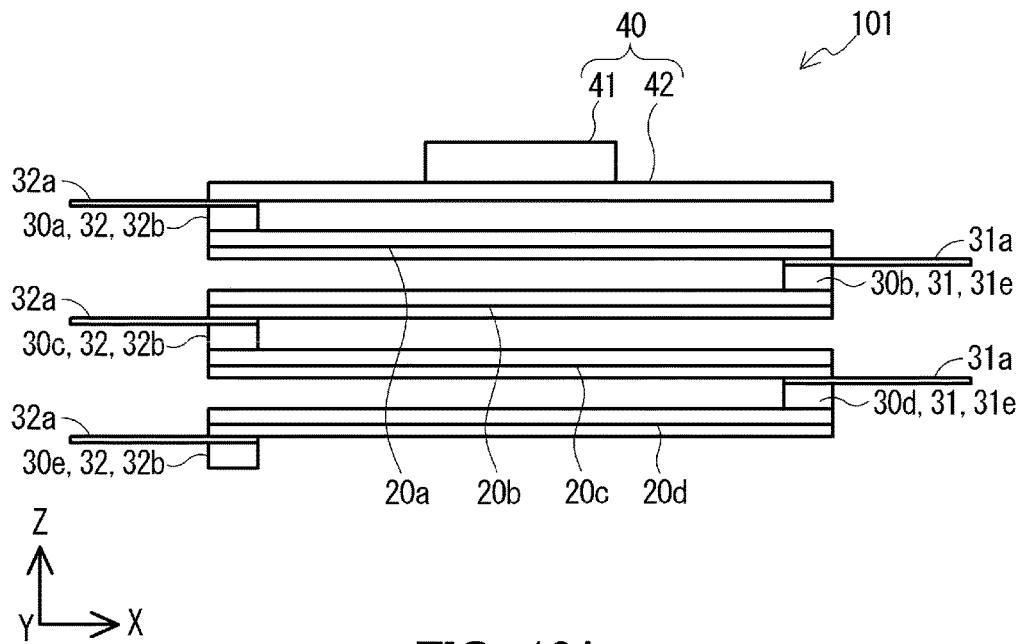
FIG. 12A is a view illustrating a state before deformation.

Functions of the power generation device 101 configured as above are as follows. FIGS. 12 are side views illustrating electromotive situations of the power generation device 101 according to the embodiment 2, in which FIG. 12A is a view illustrating a state before deformation and FIG. 12B is a view illustrating a state after the power generation device 101 is deformed upon receipt of a compression force from the outside.

Figure 12B:
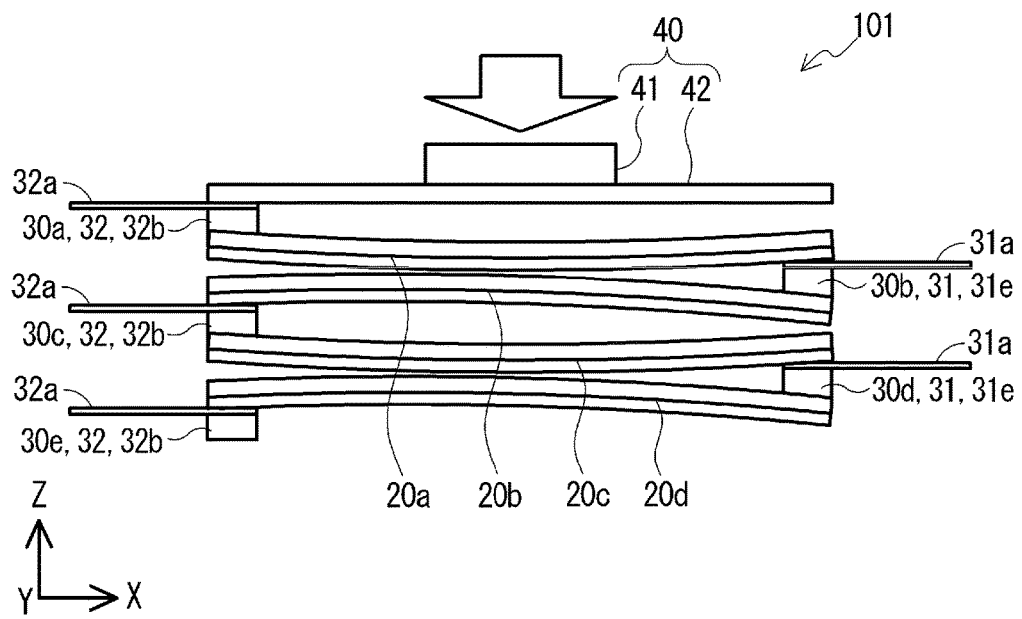
FIG. 12B is a view illustrating a state after the power generation device is deformed upon receipt of a compression force from the outside.

As illustrated in FIG. 12B, regarding deformation of the power generation plates 20a to 20d when the power generation device 101 receives the compression force from the outside, the power generation plates 20a and 20c are deformed along an upward direction, while the power generation plates 20b and 20d are deformed along a downward direction.

By the aforementioned deformation of the power generation plates 20a to 20d, electric currents of cathodes are generated on the lower side surfaces of the power generation plates 20a and 20c and on the upper side surfaces of the power generation plates 20b and 20d, while electric currents of anodes are generated on the upper side surfaces of the power generation plates 20a and 20c and the lower side surfaces of the power generation plates 20b and 20d, whereby a voltage is generated in each of the power generation plates 20. When the voltage is generated in each of the power generation plates 20 as above, the electric current of the cathode flows through the supporting sections 30b and 30d which are the first supporting sections 31 in contact with each of the power generation plates 20, and the electric current of the anode flows through the supporting sections 30a, 30c, and 30e which are the second supporting sections 32. Here, since the first electrodes 31a electrically connected to the supporting sections 30b and 30d are connected to the negative terminal 51 of the circuit board 50, the electric current of the cathode having flowed through these supporting sections 30b and 30d flows to the circuit board 50 through the first electrode 31a. Moreover, since the second electrodes 32a electrically connected to the supporting sections 30a, 30c, and 30e are connected to the positive terminal 52 of the circuit board 50, the electric current of the anode having flowed to these supporting sections 30a, 30c, and 30e flows to the circuit board 50 through the second electrode 32a. The electric current having flowed to this circuit board 50 is converted by the rectifying portion 53 to a direct current and is accumulated in the capacitor 54 and then, output to the acoustic output device or the like through the output terminal 55. As a result, the electric power generated in the power generation plates 20a to 20d can be supplied to the acoustic output device or the like through the first supporting section 31, the second supporting section 32, the first electrode 31a, the second electrode 32a, and the circuit board 50.

Effect

As described above, according to the embodiment 2, since the supporting sections 30a to 30e are disposed so that the adjacent power generation plates 20 are deformable along different directions when an external force is applied to the power generation device 10, the power generation plates 20a to 20d can be supported in a cantilever manner. As a result, as compared with supporting both ends of the power generation plates 20a to 20d, for example, the number of installed supporting sections 30 can be reduced, and weight reduction and cost reduction can be realized.

Since the first supporting section 31 electrically connected to the first electrode 31a and the second supporting section 32 electrically connected to the second electrode 32a are formed having a shape substantially following a part of the periphery of the power generation plate 20, the first supporting section 31 and the second supporting section 32 can be manufactured inexpensively as compared with the case of the shape following the whole periphery of the power generation plate 20, while stable support of the power generation plates 20a to 20d is maintained.

Embodiment 3

Subsequently, an embodiment 3 will be described. In this mode, a support means electrically connected to the first electrode is disposed at the substantially peripheral position on the side surface of the power generation plate and a support means electrically connected to the second electrode is disposed at the substantially peripheral position on the side surface of the power generation plate and moreover, the support means are disposed so that the power generation plates adjacent to each other are deformable along the same direction. It should be noted that substantially the same components as those of the embodiment 2 will be given the same reference numerals or names used in the embodiment 2 as necessary and the explanation thereof will be omitted.

Configuration

Figure 13:
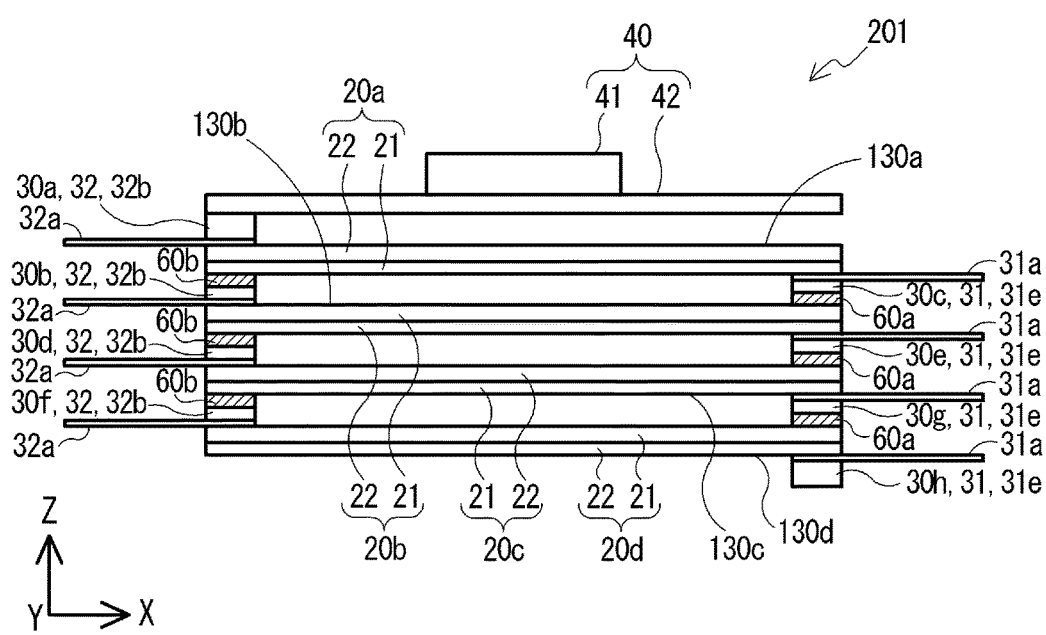
FIG. 13 is a side view illustrating a power generation device according to an embodiment 3.

First, configuration of a power generation device according to the embodiment 3 will be described. FIG. 13 is a side view illustrating the power generation device according to an embodiment 3. As illustrated in FIG. 13, a power generation device 201 according to the embodiment 3 is configured by replacing the supporting sections 30a to 30e with the supporting sections 30a to 30h among the same components as those in the power generation device 101 according to the embodiment 2, and power generation modules 130a to 130d are formed (if the power generation modules 130a to 130d do not have to be discriminated from each other, they are collectively referred to as the "power generation module 130").

Here, regarding the configuration of the supporting section 30 and the electrode, as illustrated in FIG. 13, the supporting section 30 can be broadly divided into the first supporting section 31 and the second supporting section 32, and as the first supporting section 31, the supporting sections 30c, 30e, 30g, and 30h are applicable, and as the second supporting section 32, the supporting sections 30a, 30b, 30d, and 30f are applicable. This first supporting section 31 is electrically connected to the first electrode 31a and is constituted with the support body 31e and the support body fixing portion 31f. This second supporting section 32 is electrically connected to the second electrode 32a and is constituted with the support body 32b and the support body fixing portion 32c.

Details of configurations of the power generation modules 130 have ingenuity as follows.

Details of Power Generation Module—Configuration of Power Generation Module

The power generation modules 130a to 130d are a component group constituting a power generation function in the power generation device 201. As illustrated in FIG. 13, each of these power generation modules 130a to 130d has a first electrode 31a, a first supporting section 31 electrically connected to the first electrode 31a, a second electrode 32a, a second supporting section 32 electrically connected to the second electrode 32a, and a power generation plate 20 to which the electric current is withdrawn from the first electrode 31a and the second electrode 32a (more specifically, the power generation module 130a has the supporting section 30c, the first electrode 31a electrically connected to the supporting section 30c, the supporting section 30a, the second electrode 32a electrically connected to the supporting section 30a, and the power generation plate 20a to which the electric current is withdrawn from the first electrode 31a and the second electrode 32a).

Details of Power Generation Module—Arrangement of Supporting Section

In the power generation module 130, the first supporting section 31 and the second supporting section 32 are disposed such that, when the external force is applied to the pressure receiving portion 41 of the operation portion 40, for example, all the power generation plates 20a to 20d are deformable along the juxtaposed direction of the power generation plates 20a to 20d and also the power generation plates 20 adjacent to each other are deformable along the same direction. Specifically, as illustrated in FIG. 13, the first supporting section 31 is disposed at the substantially peripheral position on the side surface of the power generation plate 20, and the second supporting section 32 is disposed at the substantially peripheral position on the side surface on the side opposite to the first supporting section 31 side in the power generation plate 20 (more specifically, the supporting section 30c is disposed at the right peripheral position on a lower side surface of the power generation plate 20a, and the supporting section 30a is disposed on the left peripheral position on an upper side surface of the power generation plate 20a).

In this case, as described above, since the power generation plates 20 adjacent to each other are deformable along the same direction, on the side surfaces faced with each other among the side surfaces of the adjacent power generation modules 130, electric currents with polarities different from each other are generated, respectively. Thus, if the power generation modules 130a to 130d are disposed so that the adjacent power generation modules 130 are brought into contact, for example, short-circuit occurs between the adjacent power generation modules 130. Thus, in order to solve such a problem, as illustrated in FIG. 13, insulating members 60a and 60b are provided between each of the power generation modules 130a to 130d (if the insulating members 60a and 60b do not have to be discriminated from each other, they are collectively referred to as the "insulating member 60").

The insulating members 60a and 60b are substantially plate-shaped bodies (or may be substantially sheet-shaped bodies) formed of an insulating material such as a resin material and a rubber material, for example. The planar shape of this insulating member 60a or 60b is arbitrary but the planar shape of the insulating member 60a is formed substantially the same as the planar shape of the support body 31b of the first supporting section 31 (or a shape larger than the support body 31b), for example. The planar shape of the insulating member 60b is formed substantially the same as the planar shape of the support body 32b of the second supporting section 32 (or a shape larger than the support body 32b). The insulating member 60a is disposed at a position in contact with the side surface on the side opposite to the power generation plate 20 side in the first supporting section 31, while the insulating member 60b is disposed at a position in contact with a portion faced with the second supporting section 32 on the side surface on the side opposite to the second supporting section 32 side in the power generation plate 20.

On each of the insulating members 60a and 60b, an insulating-member fixing portion (not shown) is provided. The insulating-member fixing portion is a portion to be mounted on the second fixing portion 11b of the base portion 11 in the housing 10 and is formed integrally with the insulating member 60. This insulating-member fixing portion is disposed so as to protrude toward the base portion 11 from the insulating member 60 and is fixed to the second fixing portion 11b of this base portion 11.

As described above, with the aforementioned arrangement of the supporting section 30, the power generation plates 20a to 20d can be deformed substantially uniformly. Since the insulating members 60a and 60b are provided between each of the power generation modules 130a to 130d, a flow of the electric current between the adjacent power generation modules 130 can be shut off, occurrence of short-circuit between the adjacent power generation modules 130 can be prevented.

Details of Power Generation Module—Thicknesses of Supporting Section, Electrode, and Insulating Member Setting of thicknesses of the supporting section 30, the electrode, and the insulating member 60 are arbitrary, but a total of the thicknesses of the first supporting section 31, the first electrode 31a, and the insulating member 60a is set to be the same as a total of the thicknesses of the second supporting section 32, the second electrode 32a, and the insulating member 60b so that each of the power generation plates 20a to 20d can be deformed to the same degree, for example. Specifically, the thickness of the first supporting section 31 is set to 0.3 mm, the thickness of the first electrode 31a is set to 0.1 mm, and the thickness of the insulating member 60a is set to 0.2 mm. Moreover, the thickness of the second supporting section 32 is set to 0.3 mm, the thickness of the second electrode 32a is set to 0.1 mm, and the thickness of the insulating member 60b is set to 0.2 mm.

Function of Power Generation Device

Figure 14A:
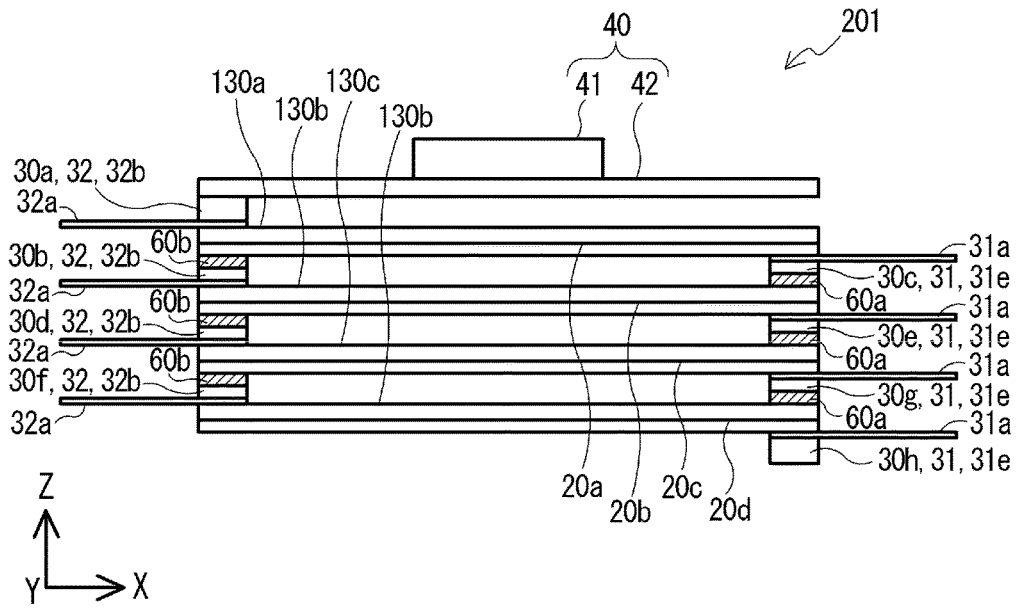
FIG. 14A is a view illustrating a state before deformation.

Functions of the power generation device 201 constituted as above are as follows. FIG. 14 are side views illustrating electromotive situations of the power generation device 201 according to the embodiment 3, in which FIG. 14A is a view illustrating a state before deformation and FIG. 14B is a view illustrating a state after the power generation device 201 is deformed upon receipt of a compression force from the outside.

Figure 14B:
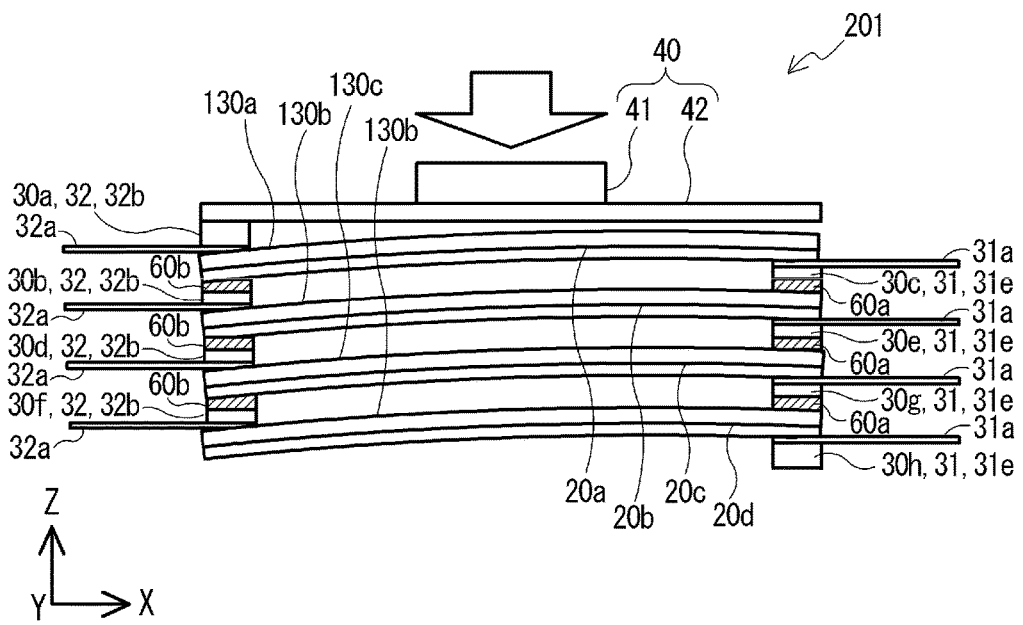
FIG. 14B is a view illustrating a state after the power generation device is deformed upon receipt of a compression force from the outside.

As illustrated in FIG. 14B, regarding deformation of the power generation plates 20a to 20d when the power generation device 201 receives the compression force from the outside, the power generation plates 20a to 20d are deformed along a downward direction.

By the aforementioned deformation of the power generation plates 20a to 20d, electric currents of cathodes are generated on the lower side surfaces of the power generation plates 20a to 20d, while electric currents of anodes are generated on the upper side surfaces of the power generation plates 20a to 20d, whereby a voltage is generated in each of the power generation plates 20. When the voltage is generated in each of the power generation plates 20 as above, the electric current of the cathode flows through the supporting sections 30c, 30e, 30g, and 30h which are the first supporting sections 31 in contact with each of the power generation plates 20, and the electric current of the anode flows through the supporting sections 30a, 30b, 30d and 30f which are the second supporting sections 32. Since the first electrodes 31a electrically connected to the supporting sections 30c, 30e, 30g, and 30h are connected to the negative terminal 51 of the circuit board 50, the electric current of the cathode having flowed through these supporting sections 30c, 30e, 30g, and 30h flows to the circuit board 50 through the first electrode 31a. Moreover, since the second electrodes 32a electrically connected to the supporting sections 30a, 30b, 30d and 30f are connected to the positive terminal 52 of the circuit board 50, the electric current of the anode having flowed to these supporting sections 30a, 30b, 30d and 30f flows to the circuit board 50 through the second electrode 32a. As a result, the electric power generated in the power generation plates 20a to 20d can be supplied to the acoustic output device or the like through the first supporting section 31, the second supporting section 32, the first electrode 31a, the second electrode 32a, and the circuit board 50.

Effect

As described above, according to the embodiment 3, since the supporting sections 30a to 30h are disposed so that the adjacent power generation plates 20 are deformable along the same direction, when an external force is applied to the power generation device 201, the power generation plates 20a to 20d can be deformed substantially uniformly, whereby power generation efficiency can be improved. Moreover, since the power generation modules 130a to 130d are formed having the first electrode 13a, the first supporting section 31 electrically connected to the first electrode 31a (the supporting sections 30c, 30e, 30g, and 30h, for example), the second electrode 32a, the second supporting section 32 electrically connected to the second electrode 32a (the supporting sections 30a, 30b, 3d, and 30f, for example), and the power generation plates 20 to which the electric current is withdrawn from the first electrode 31a and the second electrode 32a, and the insulating members 60a and 60n are provided between the power generation modules 130a to 130d, the flow of the electric current between the adjacent power generation modules 130 can be shut off, and occurrence of short-circuit between the adjacent power generation modules 130 can be prevented.

Variation of Embodiments

The embodiments according to the present invention have been described, but specific configuration and means of the present invention can be arbitrarily changed or improved within a range of the technical idea of each invention described in the claim. Such variations will be described below.

Problems To be Solved and Effects of the Invention

First, the problems to be solved or effects of the invention are not limited to the aforementioned contents, but the present invention can solve a problem not described in the above or can exert an effect not described in the above or solves only a part of the described problems or exerts only a part of the described effects in some cases. For example, even in the cases where the supporting section is difficult to be formed as an electrode, if the formation of the electrode of the supporting section can be achieved as well as the prior art but with different technologies from the prior art, the problem of the present invention is solved.

Combination of Each of Embodiments

Figure 15:
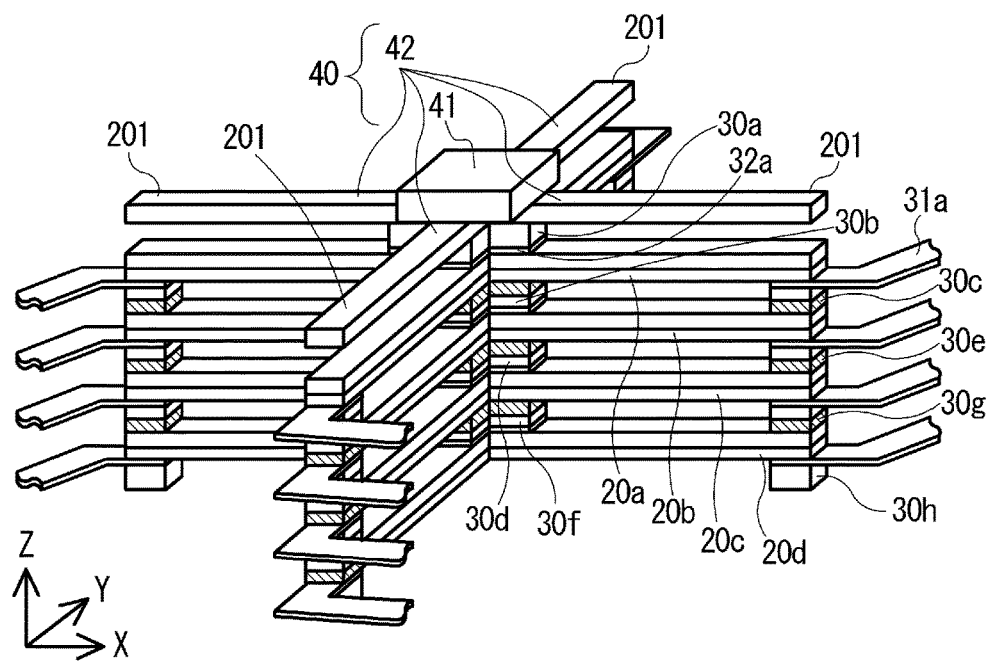
FIG. 15 is a perspective view illustrating a variation of the power generation device according to the embodiment 3.
Figure 16:
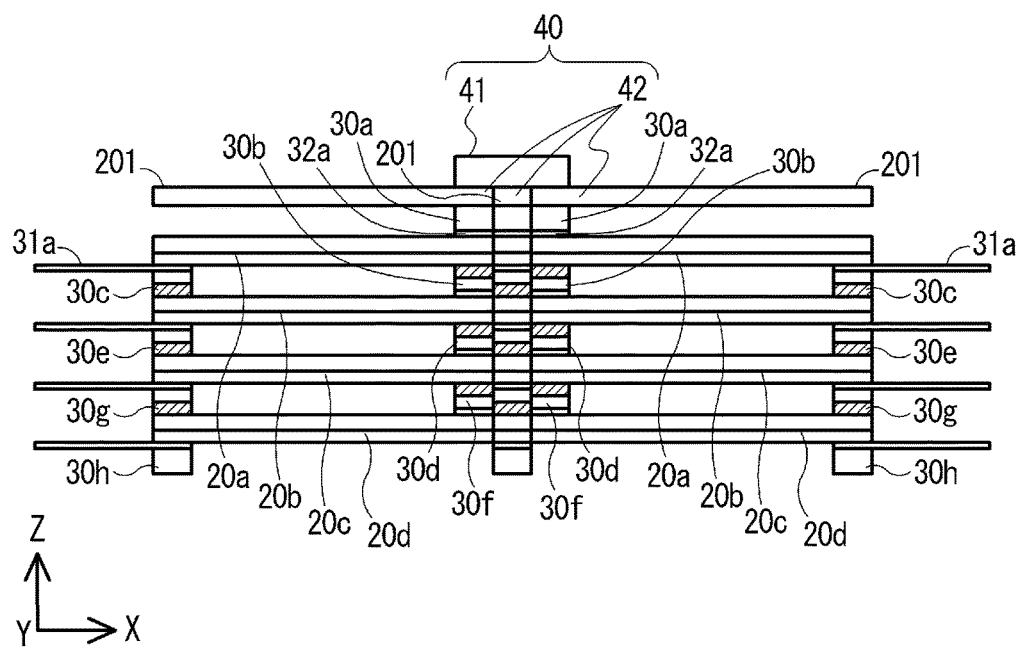
FIG. 16 is a side view of the power generation device in FIG. 15.

For the configuration illustrated in the embodiments 1 to 3, a plurality of the configurations of the same embodiment can be combined or the configurations of the different embodiments can be combined. For example, as illustrated in FIGS. 15 and 16, a plurality of the power generation devices 201 according to the embodiment 3 may be combined. Specifically, four units of the power generation devices 201, each formed of the rectangular power generation plate 20, are disposed in a cross shape. Moreover, regarding arrangement of the supporting sections 30a to 30h in each of the power generation devices 201, as illustrated in FIG. 16, the supporting sections 30a to 30h are disposed so that all the power generation plates 20a to 20d of each of the power generation devices 201 are deformable when the external force is applied to the pressure receiving portion 41 of the operation portion 40 common to the four units of the power generation devices 201. By means of such configuration, a power generation amount can be further improved. Alternatively, the power generation device 101 according to the embodiment 2 and the power generation device 201 according to the third embodiment 3 may be combined.

Configuration of Power Generation Device

Figure 17:
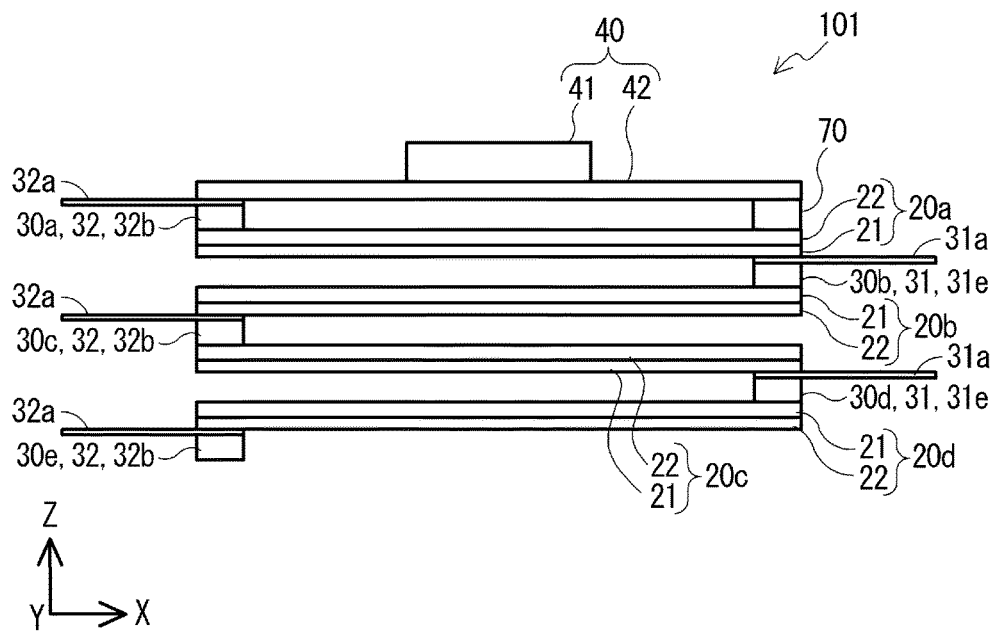
FIG. 17 is a side view illustrating a variation of the power generation device according to the embodiment 2.

In the aforementioned embodiment 2, it is described that the power generation device 101 comprises the power generation plates 20a to 20d, the supporting sections 30a to 30e, and the operation portion 40 inside the housing 10, but this is not limiting. For example, as illustrated in FIG. 17, in the power generation device 101 according to the embodiment 2, a spacer 70 may be provided in configuration in addition to the aforementioned components of the power generation device 101 so that only a part of the power generation plates 20a to 20d can be deformed. The spacer 70 is a deformation preventing means for preventing deformation of the power generation plate 20. This spacer 70 is a substantially plate-shaped body with a thickness of the spacer 70 formed substantially the same as a distance between the power generation plates 20. Regarding arrangement of this spacer 70, this spacer 70 is disposed at a position corresponding to the first supporting section 31 on the side surface on the side where the second supporting section 32 in the power generation plate 20 is provided, for example (In FIG. 17, it is disposed at a position corresponding to the supporting section 30b on the upper side surface of the power generation plate 20a). Alternatively, not limited to that, this spacer 70 may be disposed at a position corresponding to the second supporting section 32 on the side surface on the side where the first supporting section 31 in the power generation plate 20 is provided. As a result, even if the external force is applied to the power generation device 101, deformation of the power generation plate 20 on which the spacer 70 is provided can be prevented, and a power generation amount can be adjusted in accordance with a situation.

Housing

Figure 18:
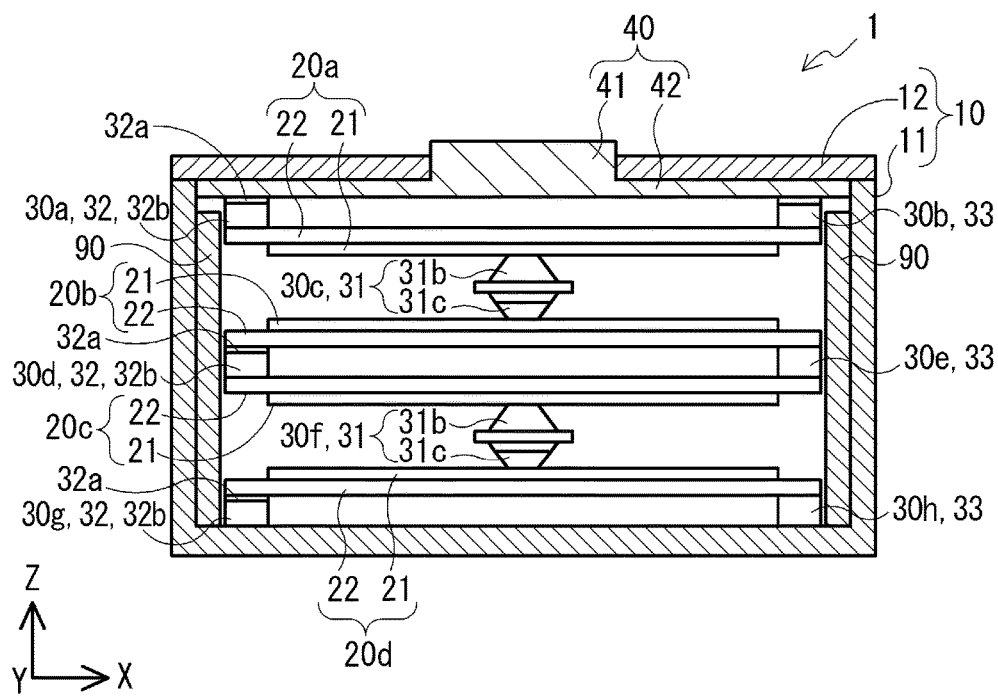
FIG. 18 is a side view illustrating a variation of the power generation device according to the embodiment 1.

In the aforementioned embodiments 1 to 3, it is described that the first fixing portion 11a, the second fixing portion 11b, and the notched portion 11c are provided on the base portion 11 of the housing 10, but this is not limiting. For example, as illustrated in FIG. 18, in the power generation device 1 according to the embodiment 1, a stopper 90 may be further provided on the base portion 11 of the housing 10. The stopper 90 is a movement limiting means for limiting a movement amount of the operation portion 40 when the external force is applied to the operation portion 40. This stopper 90 is formed by directing inward a part of the side wall of the base portion 11 having a substantially convex shape and is disposed at a position in contact with the operation portion 40 when the movement amount of the operation portion 40 reaches the predetermined amount (the same shall apply to the power generation device according to the embodiments 2 and 3). As a result, excessive deformation of the power generation plates 20a to 20d can be prevented, and breakage or the like of the power generation plates 20a to 20d can be reduced. The installation position of this stopper 90 is not limited to the base portion 11 but may be on the cover portion 12 of the housing 10, for example.

Figure 19:
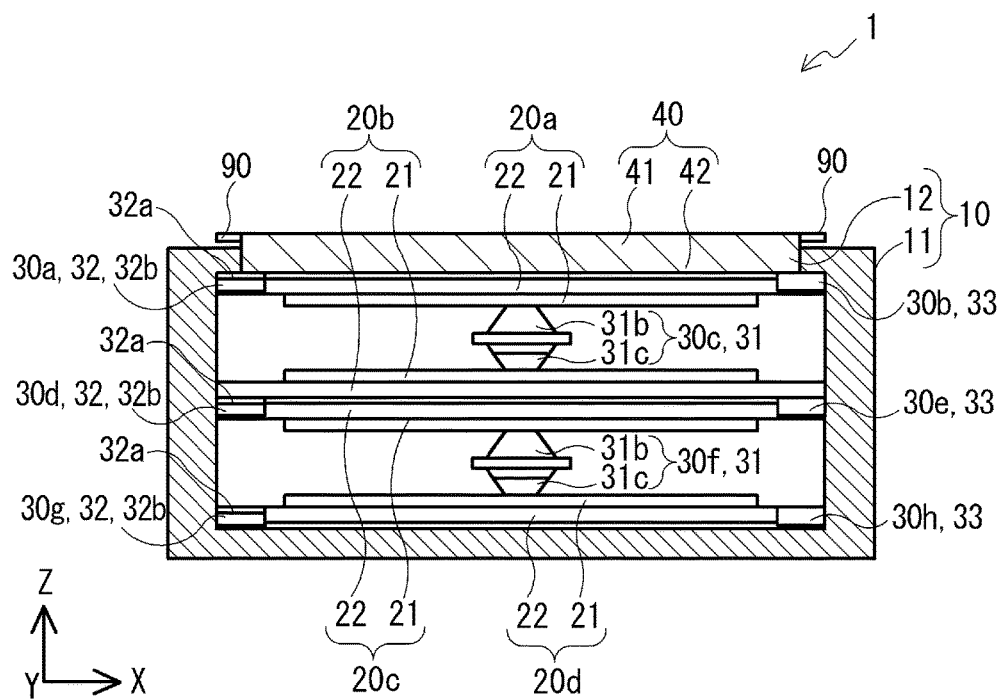
FIG. 19 is a side view illustrating a variation of the power generation device according to the embodiment 1.

Moreover, in the aforementioned embodiments 1 to 3, it is described that the cover portion 12 of the housing 10 and the operation portion 40 are formed separately, but this is not limiting. For example, as illustrated in FIG. 19, in the power generation device 1 according to the embodiment 1, the cover portion 12 and the operation portion 40 may be formed integrally (the same shall apply to the power generation device according to the embodiments 2 and 3). By means of this configuration, the length of the operation portion 40 in the up-down direction can be reduced, and the power generation device 1 can be made compact. In order to improve the performances of the power generation device 1, the following configuration may be employed. Specifically, the planar shape of the pressure receiving portion 41 may be set to a shape larger than the planar shape of the pressure receiving portion 41 of the embodiment 1 in order to improve operability of the operation portion 40 (for example, being formed having a shape substantially the same as the planar shape of the transmission portion 42). Moreover, in order to make the power generation device 1 more compact, the power generation plate 20 may be disposed so that a part of the power generation plate 20 is fitted between the first supporting section and the second supporting section. Moreover, in order to improve manufacturability of the power generation device 1, the supporting sections 30g and 30h may be formed integrally with the base portion 11. Moreover, in order to suppress excessive deformation of the power generation plate 20, the stopper 90 formed having a substantially annular shape may be mounted on the operation portion 40.

Power Generation Plate

In the aforementioned embodiments 1 to 3, it is described that the shape of the power generation plate 20 is a substantially disk-shaped body but this is not limiting and may be formed having a rectangular shape (e.g. triangle, square, pentagon and the like) or a fan shape, for example. In this case, the shapes of the piezoelectric element 21 and the vibration plate 22 may be formed having a rectangular shape (a triangle, a square, a pentagon and the like) or a fan shape.

Moreover, in the aforementioned embodiments 1 to 3, it is described that the number of installed power generation plates 20 is four, but this is not limiting and it may be two or three or may be four or more, for example.

Moreover, in the aforementioned embodiments 1 to 3, it is described that the piezoelectric element 21 is provided on one of the side surfaces of the vibration plate 22 (a so-called unimorph type), but the piezoelectric element 21 may be provided on the both side surfaces of the vibration plate 22 (a so-called bimorph type), for example.

Moreover, in the aforementioned embodiments 1 to 3, it is described that the power generation plate 20 is constituted with the piezoelectric element 21 and the vibration plate 22, but in order to protect the piezoelectric element 21 or the like, a resin (a piezofilm or the like) for covering the whole of or a part of the piezoelectric element 21 may be further provided, for example. Alternatively, the vibration plate 22 may be omitted, for example.

Moreover, in the aforementioned embodiments 1 to 3, it is described that the power generation plate 20 comprises the piezoelectric element 21, but instead of the piezoelectric element 21, a mechanism (specifically, an artificial muscle, a hydraulic motor, an electromagnetic induction-type motor, a super magnetostriction and the like) capable of generating power by a reciprocating motion may be provided, for example.

Moreover, in the aforementioned embodiments 1 to 3, it is described that these power generation plates 20a to 20d are juxtaposed so that all of the power generation plates 20a to 20d are overlapped in the laminated manner and also, so that the centers of gravity of the power generation plates 20a to 20d are located at the same position along the juxtaposed direction, but this is not limiting. For example, these power generation plates 20a to 20d may be juxtaposed so that a part of the power generation plates 20a to 20d are overlapped in the laminated manner.

Operation Portion

Figure 20:
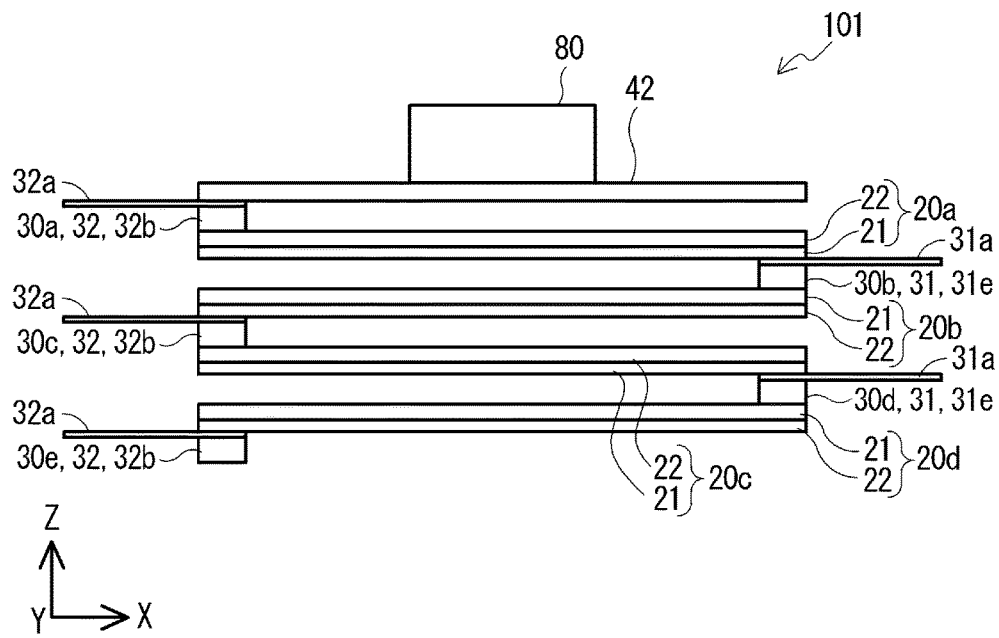
FIG. 20 is a side view illustrating a variation of the power generation device according to the embodiment 2.
Figure 21A:
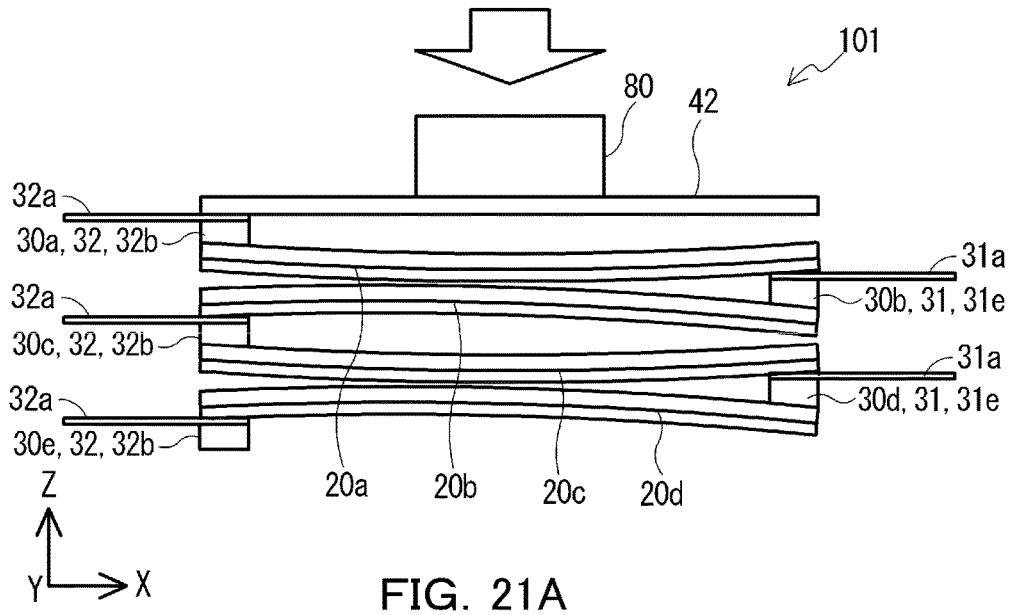
FIG. 21A is a view illustrating a state of deformation with downward movement in a weight and FIG. 21B is a view illustrating a state of deformation with upward movement in the weight.
Figure 21B:
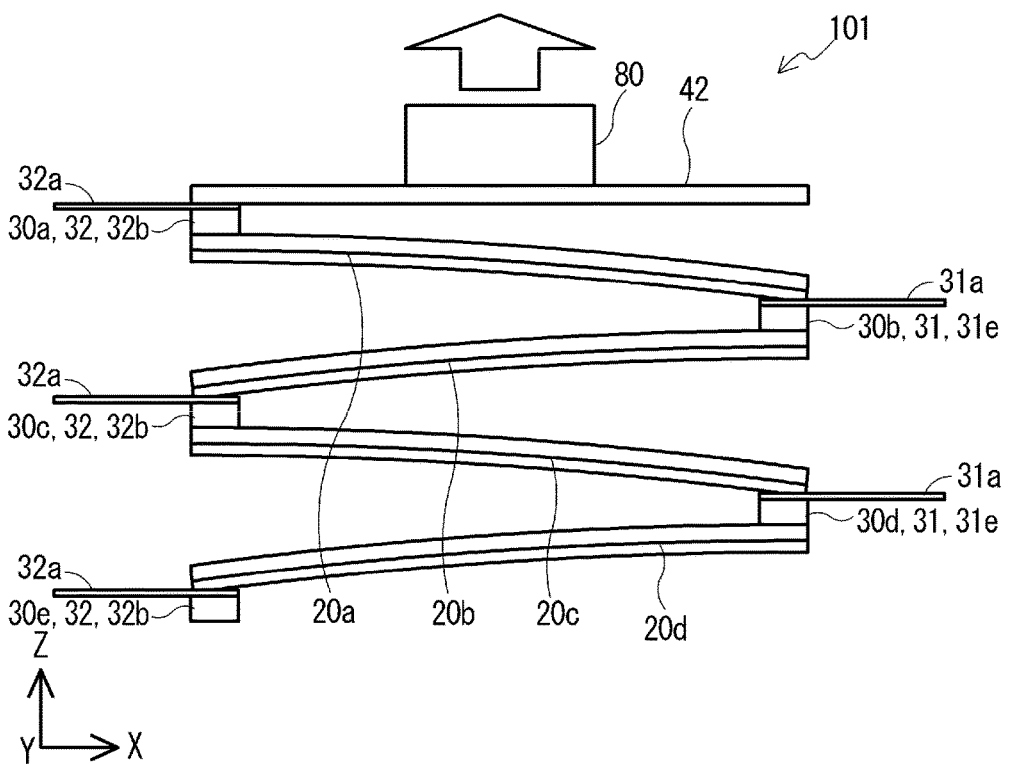

In the aforementioned embodiments 1 to 3, it is described that the operation portion 40 comprises the pressure receiving portion 41 and the transmission portion 42, but this is not limiting. For example, as illustrated in FIG. 20, in the power generation device 101 according to the embodiment 2, the operation portion 40 may be constituted with a weight 80 instead of the pressure receiving portion 41 and each of the supporting sections 30a to 30e may be connected to the power generation plate 20 by a fixing tool or an adhesive or the like so that the power generation plates 20a to 20d are capable of oscillation along the Z-direction. Here, the weight 80 is to adjust a natural frequency of the power generation device 101 and is a substantially rectangular body (or may be a substantially columnar body or a substantially spherical body) formed of a steel material, for example, and is connected to the transmission portion 42 by a fixing tool or the like. By means of such configuration, as illustrated in FIG. 21, the power generation plates 20a to 20d can be deformed with vertical movement in the weight 80, whereby efficient power generation can be realized.

Circuit Board

In the aforementioned embodiments 1 to 3, it is described that the circuit board 50 is provided outside the housing 10 but may be contained inside the housing 10, for example.

Material of Supporting Section

In the aforementioned embodiments 1 to 3, it is described that a conductive material such as a metal material (copper, steel, stainless, and aluminum, for example) with strength higher than that of the power generation plate 20 is used for the materials of the first supporting section 31 and the second supporting section 32 so that the electric current generated in the power generation plate 20 can be withdrawn, but this is not limiting. For example, if the electric current is withdrawn by connecting the positive terminal and the negative terminal to the piezoelectric elements 21 of a part of the power generation plates 20 in the power generation plates 20a to 20d and by wiring the positive terminal (or the negative terminal) and the lead wire, the first supporting section 31 or the second supporting section 32 supporting the power generation plate 20 may be formed of a material (an insulating material such as a resin material, for example) other than the conductive material.

First Supporting Section and Second Supporting Section

In the aforementioned embodiments 2 and 3, it is described that the planar shape of the support body 31b of the first supporting section 31 is formed having a substantially arc shape, but this is not limiting. For example, if the planar shape of the power generation plate 20 is formed having a substantially rectangular shape, the planar shape of the support body 31b may be formed having a substantially rectangular shape.

Moreover, in the aforementioned embodiments 1 to 3, it is described that the planar shape of the support body 32b in the second supporting section 32 is formed having a substantially arc shape, but this is not limiting. For example, if the planar shape of the power generation plate 20 is formed having a substantially rectangular shape, the planar shape of the support body 32b may be formed having a substantially rectangular shape.

Moreover, in the aforementioned embodiments 2, it is described that the first supporting section 31 is disposed at the right peripheral position on the side surface of the power generation plate 20 and the second supporting section 32 is disposed at the left peripheral position on the side surface of the power generation plate 20 as illustrated in FIG. 13, but this is not limiting. For example, the first supporting section 31 and the second supporting section 32 may be disposed at the left peripheral position on the side surface of the power generation plate 20 (alternatively, they may be disposed at the right peripheral position on the side surface of the power generation plate 20). In this case, regarding arrangement of the insulating members 60a and 60b, the insulating member 60a is disposed at the right peripheral position on the side surface of the power generation plate 20 so as to be in contact with the power generation plate 20, for example. The insulating member 60b is disposed at the left peripheral position on the side surface of the power generation plate 20 so as to be in contact with the side surface on the side opposite to the power generation plate 20 side in the first supporting section 31.

Deformation Suppressing Portion

In the aforementioned embodiment 1, it is described that the deformation suppressing portion 31d is provided on the first electrode 31a, but short-circuit of the first electrode 31a may be prevented by configuration other than the deformation suppressing portion 31d. For example, an insulating sheet may be provided on the first electrode 31a. The insulating sheet is a substantially sheet-shaped body formed of an insulating material such as a resin material, for example, and is disposed so as to cover a portion of the power generation plate 20 faced with the vibration plate 22 on the side surface of the first electrode 31a and is fixed to the first electrode 31a by an adhesive or the like.

Moreover, in the aforementioned embodiment 1, it is described that the deformation suppressing portion 31d is provided on the both side surfaces of the first electrode 31a, but the deformation suppressing portion 31d may be provided on either one of the side surfaces of the first electrode 31a, for example. Moreover, in order that deformation of the power generation plate 20 can be reliably suppressed, a plurality of the deformation suppressing portions 31d may be provided on either one of the side surfaces of the first electrode 31a.

The invention claimed is:

1. A power generation device for converting an external force to electricity by using a power generation element and the power generation device comprises:
   a plurality of the power generation plates juxtaposed in an overlapping state at an interval from each other, the power generation plate having the power generation element or the power generation plate having a substantially plate-shaped conductive member having flexibility and the power generation element fixed at least to either one of side surfaces of the conductive member; and
   a plurality of support means provided between the plurality of power generation plates and supporting the plurality of power generation plates, wherein
   the plurality of support means are disposed so that, when an external force is applied to the power generation device, at least a part of the plurality of power generation plates is deformable along a juxtaposed direction of the plurality of power generation plates,
   the support means in contact with one of the side surfaces of at least one power generation plate in at least a part of the plurality of power generation plates is formed of a conductive material, a first electrode for withdrawing an electric current generated in the power generation plate to an outside with respect to the support means is formed integrally with or separately from the support means, the support means in contact with the other of the side surfaces of the power generation plate is formed of the conductive material, and a second electrode for withdrawing the electric current generated in the power generation plate to the outside with respect to the support means and with a polarity different from that of the first electrode, is formed integrally with or separately from the support means,
   the power generation element of the power generation plate facing one of the side faces of the first electrode and the power generation element of the power generation plate facing the other side of the side faces of the first electrode are disposed at a position in contact with the first electrode such that the current generated by the power generation plate facing one of the side faces of the first electrode and the power generation plate facing the other side of the side faces of the first electrode can be drawn out by the first electrode, and
   the support means electrically connected to the first electrode is disposed at a substantially center position or at a substantially peripheral position on the side surface of the power generation plate and the support means electrically connected to the second electrode is disposed at the substantially peripheral position on the side surface of the power generation plate.

2. The power generation device according to claim 1, wherein the support means electrically connected to the first electrode is disposed at the substantially center position on the side surface of the power generation plate, and
   the support means electrically connected to the first electrode comprises:

a first contact portion provided integrally with the first electrode and in contact with one of a pair of the power generation plates supported by the support means; and a second contact portion provided integrally with the first electrode and in contact with the other of the pair of the power generation plates.

3. The power generation device according to claim 1, wherein the support means electrically connected to the first electrode is disposed at the substantially center position on the side surface of the power generation plate, the power generation plate having the conductive member and the power generation element fixed to one of side surfaces of the conductive member, and a short-circuit preventing means for preventing short-circuit of the first electrode by contact between the first electrode and the conductive member of the power generation plate is provided on the first electrode.

4. The power generation device according to claim 3, wherein the short-circuit preventing means is a deformation suppressing means for suppressing deformation of the power generation plate so as to prevent contact between the first electrode and the conductive member of the power generation plate.

5. The power generation device according to claim 1, wherein the support means electrically connected to the first electrode is disposed at a substantially peripheral position on the side surface of the power generation plate, and the plurality of support means is disposed so that, when an external force is applied to the power generation device, the adjacent power generation plates are deformable along different directions.

6. The power generation device according to claim 1, wherein the support means electrically connected to the first electrode is disposed at a substantially peripheral position on the side surface of the power generation plate, and the plurality of support means is disposed so that, when an external force is applied to the power generation device, the adjacent power generation plates are deformable along the same direction, a plurality of power generation modules is formed, each having the first electrode, the support means electrically connected to the first electrode, the second electrode, the support means electrically connected to the second electrode, and the power generation plate in which an electric current is withdrawn from the first electrode and the second electrode, and an insulating member is provided between the plurality of power generation modules.

7. The power generation device according to claim 1, wherein the support means electrically connected to the first electrode is disposed at the substantially peripheral position on the side surface of the power generation plate, and the support means electrically connected to the first electrode or the support means electrically connected to the second electrode is formed having a shape substantially following a part of a periphery of the power generation plate.

8. The power generation device according to claim 1, comprising:

an operation means for transmitting the external force to the plurality of power generation plates by moving itself when an external force is applied to the power generation device, and a movement limiting means for limiting a moving amount of the operation means, when the external force is applied to the power generation device.

9. A power generation device for converting an external force to electricity by using a power generation element and the power generation device comprises:

a plurality of the power generation plates juxtaposed in an overlapping state at an interval from each other, the power generation plate having the power generation element or the power generation plate having a substantially plate-shaped conductive member having flexibility and the power generation element fixed at least to either one of side surfaces of the conductive member; and a plurality of support means provided between the plurality of power generation plates and supporting the plurality of power generation plates, wherein the plurality of support means are disposed so that, when an external force is applied to the power generation device, at least a part of the plurality of power generation plates is deformable along a juxtaposed direction of the plurality of power generation plates, the support means in contact with one of the side surfaces of at least one power generation plate in at least a part of the plurality of power generation plates is formed of a conductive material, a first electrode for withdrawing an electric current generated in the power generation plate to an outside with respect to the support means is formed integrally with or separately from the support means, the support means in contact with the other of the side surfaces of the power generation plate is formed of the conductive material, and a second electrode for withdrawing the electric current generated in the power generation plate to the outside with respect to the support means and with a polarity different from that of the first electrode, is formed integrally with or separately from the support means, the support means electrically connected to the first electrode is disposed at a substantially center position or at a substantially peripheral position on the side surface of the power generation plate and the support means electrically connected to the second electrode is disposed at the substantially peripheral position on the side surface of the power generation plate, the support means electrically connected to the first electrode is disposed at the substantially center position on the side surface of the power generation plate, the support means electrically connected to the first electrode comprises:

a first contact portion provided integrally with the first electrode and in contact with one of a pair of the power generation plates supported by the support means; and a second contact portion provided integrally with the first electrode and in contact with the other of the pair of the power generation plates.

10. A power generation device for converting an external force to electricity by using a power generation element and the power generation device comprises:

a plurality of the power generation plates juxtaposed in an overlapping state at an interval from each other, the power generation plate having the power generation element or the power generation plate having a substantially plate-shaped conductive member having flexibility and the power generation element fixed at least to either one of side surfaces of the conductive member; and a plurality of support means provided between the plurality of power generation plates and supporting the plurality of power generation plates, wherein the plurality of support means are disposed so that, when an external force is applied to the power generation device, at least a part of the plurality of power generation plates is deformable along a juxtaposed direction of the plurality of power generation plates, the support means in contact with one of the side surfaces of at least one power generation plate in at least a part of the plurality of power generation plates is formed of a conductive material, a first electrode for withdrawing an electric current generated in the power generation plate to an outside with respect to the support means is formed integrally with or separately from the support means, the support means in contact with the other of the side surfaces of the power generation plate is formed of the conductive material, and a second electrode for withdrawing the electric current generated in the power generation plate to the outside with respect to the support means and with a polarity different from that of the first electrode, is formed integrally with or separately from the support means, the support means electrically connected to the first electrode is disposed at a substantially center position on the side surface of the power generation plate and the support means electrically connected to the second electrode is disposed at a substantially peripheral position on the side surface of the power generation plate, the power generation plate having the conductive member and the power generation element fixed to one of side surfaces of the conductive member, and a short-circuit preventing means for preventing short-circuit of the first electrode by contact between the first electrode and the conductive member of the power generation plate is provided on the first electrode.

11. The power generation device according to claim 10, wherein the short-circuit preventing means is a deformation suppressing means for suppressing deformation of the power generation plate so as to prevent contact between the first electrode and the conductive member of the power generation plate.

* * * * *